United States Patent
Hwang et al.

(10) Patent No.: US 11,305,364 B2
(45) Date of Patent: Apr. 19, 2022

(54) APPARATUS AND METHOD FOR ATTACHING INTERCONNECTOR OF SOLAR CELL PANEL

(71) Applicant: LG ELECTRONICS INC., Seoul (KR)

(72) Inventors: Sunghyun Hwang, Seoul (KR); Jinsung Kim, Seoul (KR); Woojoong Kang, Seoul (KR); Jangho Kim, Seoul (KR); Dongju Kang, Seoul (KR); Kyuhyeok Sim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 274 days.

(21) Appl. No.: 16/399,691

(22) Filed: Apr. 30, 2019

(65) Prior Publication Data

US 2019/0255641 A1 Aug. 22, 2019

Related U.S. Application Data

(63) Continuation of application No. 15/282,609, filed on Sep. 30, 2016, now Pat. No. 10,335,882.

(30) Foreign Application Priority Data

Oct. 2, 2015 (KR) .................. 10-2015-0139274
Dec. 23, 2015 (KR) .................. 10-2015-0184583

(51) Int. Cl.
*H01L 31/05* (2014.01)
*H01L 31/18* (2006.01)
(Continued)

(52) U.S. Cl.
CPC .............. *B23K 3/04* (2013.01); *B23K 1/0016* (2013.01); *B23K 3/087* (2013.01); *H01L 31/05* (2013.01);
(Continued)

(58) Field of Classification Search
CPC ........ B23K 3/04; B23K 1/0016; B23K 3/087; H01L 31/05; H01L 31/0504; H01L 31/188; Y02E 10/50
See application file for complete search history.

(56) References Cited

U.S. PATENT DOCUMENTS 7,828,031 B2 11/2010 Micciche
2003/0127124 A1 7/2003 Jones
(Continued)

FOREIGN PATENT DOCUMENTS

DE 102006006715 A1 8/2006
DE 102011081674 A1 * 2/2013 ........... H01L 31/188
(Continued)

*Primary Examiner* — Hoang-Quan Ho
(74) *Attorney, Agent, or Firm* — Birch, Stewart, Kolasch & Birch, LLP

(57) ABSTRACT

A solar cell connecting method for manufacturing a solar cell string, includes placing first interconnectors on a working table by a first fixing member fixing both sides of the first interconnectors in a longitudinal direction and transporting the first interconnectors in a state that the first interconnectors are spaced apart from each other at intervals; placing a first solar cell on the first interconnectors, fixing the first solar cell and the first interconnectors by an exhaust adsorption, and releasing the first fixing member from the first interconnectors; and placing second interconnectors on the first solar cell and the working table by the first fixing member fixing both sides of the second interconnectors in a longitudinal direction and transporting the second interconnectors in a state that the second interconnectors are spaced apart from each other at intervals.

9 Claims, 20 Drawing Sheets

(51) Int. Cl.
  *B23K 3/04* (2006.01)
  *B23K 1/00* (2006.01)
  *B23K 3/08* (2006.01)

(52) U.S. Cl.
  CPC ........ *H01L 31/0504* (2013.01); *H01L 31/188* (2013.01); *Y02E 10/50* (2013.01)

(56) References Cited

U.S. PATENT DOCUMENTS

| | | |
|---|---|---|
| 2005/0217718 A1 | 10/2005 | Dings et al. |
| 2007/0079862 A1 | 4/2007 | Kawagoe et al. |
| 2008/0230117 A1 | 9/2008 | Katayama et al. |
| 2008/0237300 A1 | 10/2008 | Katayama et al. |
| 2009/0001140 A1 | 1/2009 | Katayama et al. |
| 2015/0076214 A1 | 3/2015 | Kodama et al. |

FOREIGN PATENT DOCUMENTS

| | | |
|---|---|---|
| JP | 2000-22188 A | 1/2000 |
| JP | 2005-235971 A | 9/2005 |
| JP | 2006-229240 A | 8/2006 |
| JP | 2007-173619 A | 7/2007 |
| JP | 2008-235554 A | 10/2008 |
| JP | 2011-49514 A | 3/2011 |
| JP | 2011-88165 A | 5/2011 |
| JP | WO2013/128568 A1 | 9/2013 |
| JP | 2014-49513 A | 3/2014 |
| JP | 2014-103300 A | 6/2014 |
| KR | 10-1305088 B1 | 10/2013 |
| KR | 10-1462601 B1 | 11/2014 |
| WO | WO 2013/077111 A1 | 5/2013 |
| WO | WO 2014/002229 A1 | 1/2014 |
| WO | WO 2014/076134 A1 | 5/2014 |

\* cited by examiner

FIG. 9
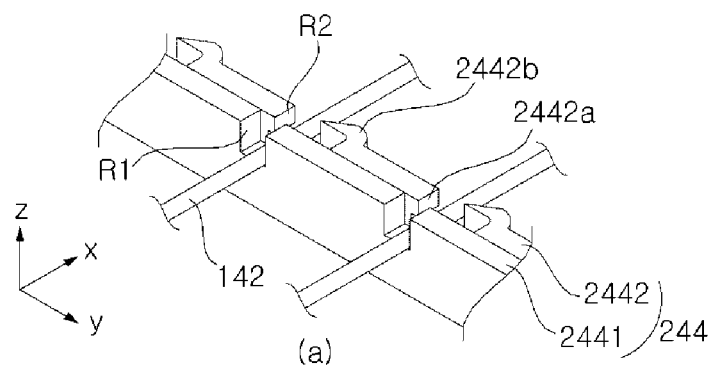
(a)
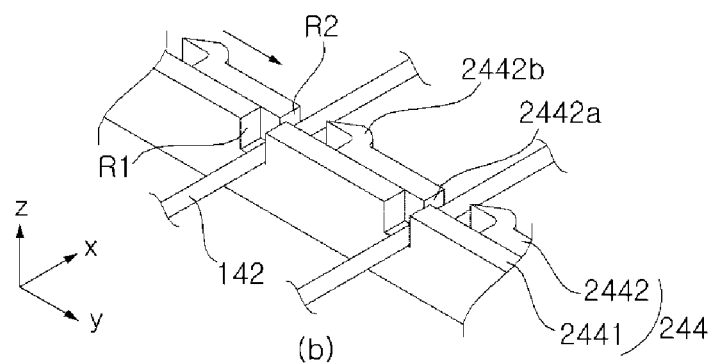
(b)
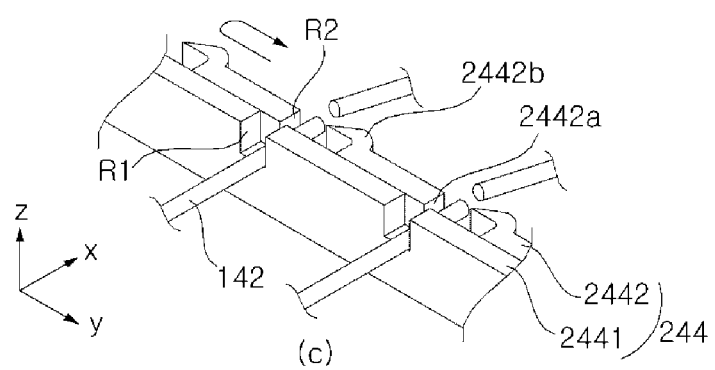
(c)

APPARATUS AND METHOD FOR ATTACHING INTERCONNECTOR OF SOLAR CELL PANEL

CROSS-REFERENCE TO RELATED APPLICATIONS

This application is Continuation of U.S. patent application Ser. No. 15/282,609, filed on Sep. 30, 2016 (now U.S. Pat. No. 10,335,882, issued on Jul. 2, 2019), which claims the priority benefit of Korean Patent Applications No. 10-2015-0139274, filed on Oct. 2, 2015 and No. 10-2015-0184583, filed on Dec. 23, 2015 in the Korean Intellectual Property Office, the disclosures of all of these applications are incorporated herein by reference into the present application.

BACKGROUND OF THE INVENTION

Field of the Invention

The present inventive concept relates to an apparatus and a method for attaching interconnectors of solar cell panels, and more particularly, to an apparatus and a method for attaching interconnectors of solar cell panels that interconnect a plurality of solar cells.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

A plurality of solar cells is connected to each other in series or in parallel using ribbons, and is manufactured into a solar cell panel via packaging, which is a process for protecting the solar cells. The solar cell panel needs to perform electricity generation for a long term in various environments, thus requiring considerable long-term reliability. At this time, the solar cells are conventionally connected to one another using the ribbons.

However, an apparatus and method for attaching the ribbons may be complex, thus causing deterioration in productivity. In addition, when interconnectors, which have a structure that is different from that of the ribbons, are used instead of the ribbons, no apparatus or method for attaching the interconnectors has been proposed.

SUMMARY OF THE INVENTION

Therefore, the present inventive concept has been made in view of the above problems, and it is an object of the present inventive concept to provide an apparatus and method for attaching interconnectors of solar cell panels, which may improve productivity by attaching the interconnectors to solar cells using an automated system.

According to one aspect of the present inventive concept, the above and other objects can be accomplished by the provision of a method for attaching an interconnector of a solar cell panel, the method including forming a first interconnector-jig coupling by fixing a plurality of first interconnectors to a jig, locating the first interconnector-jig coupling over a working table, fixing the first interconnectors and a first solar cell to each other, separating the jig from the first interconnectors, and attaching the first interconnectors to the first solar cell by applying heat to the first interconnectors and the first solar cell, which are thereby fixed to each other.

According to another aspect of the present inventive concept, there is provided an apparatus for attaching an interconnector of a solar cell panel, the apparatus including an interconnector fixing unit for forming an interconnector-jig coupling by fixing a plurality of interconnectors to a jig, a working table on which the interconnector-jig coupling is placed to fix the interconnectors to a solar cell, and a heat source for attaching the interconnectors and the solar cell to each other by applying heat to the interconnectors and the solar cell, which are thereby fixed to each other, wherein the jig is separated from the interconnectors prior to passing through the heat source.

According to a further aspect of the present inventive concept, there is provided an apparatus for attaching an interconnector of a solar cell panel, the apparatus including an interconnector supply unit for providing an interconnector, a clamping unit for clamping and fixing the interconnector, and an attachment unit for attaching the interconnector to a solar cell, wherein the clamping unit includes a first clamp having a first contact portion located on one side of the interconnector so as to come into contact with the one side of the interconnector, and a second clamp having a second contact portion located on a remaining side of the interconnector opposite the first contact portion so as to correspond to the first contact portion and to come into contact with the remaining side of the interconnector, and wherein the first contact portion includes a contact, and a recess formed so as to be spaced further apart from the second clamp than the contact.

In addition, the present inventive concept is devised to provide an apparatus for attaching interconnectors of solar cell panels, which may improve productivity.

BRIEF DESCRIPTION OF THE DRAWINGS

The above and other objects, features and other advantages of the present inventive concept will be more clearly understood from the following detailed description taken in conjunction with the accompanying drawings, in which:

FIG. 9 is a view illustrating an operation of a cutter included in the interconnector attachment apparatus of FIG. 6;

DETAILED DESCRIPTION OF THE EMBODIMENTS

Figure 1:
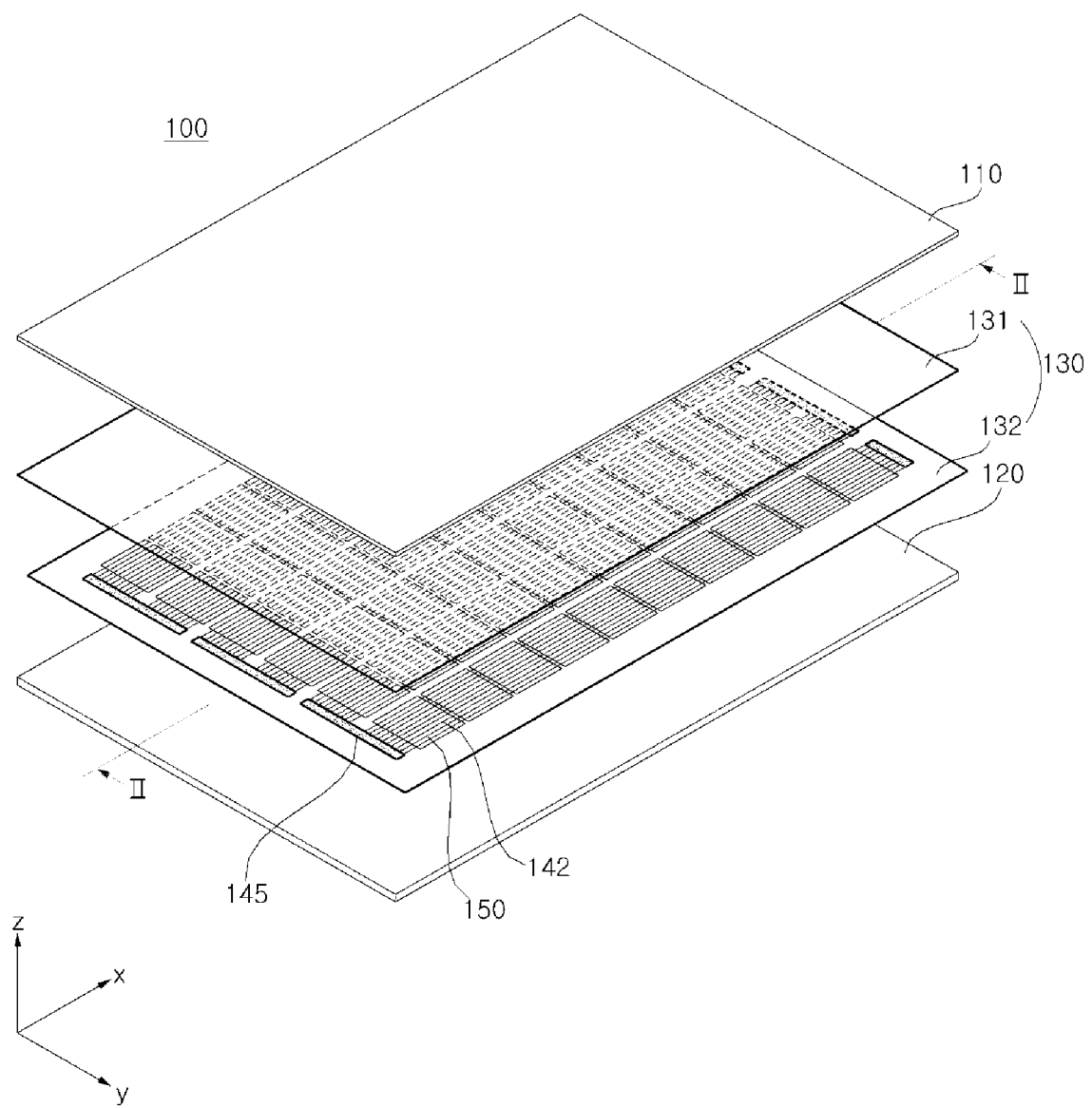
FIG. 1 is a perspective view illustrating a solar cell panel according to an embodiment of the present inventive concept.

Reference will now be made in detail to the embodiments of the present inventive concept, examples of which are illustrated in the accompanying drawings. However, it will be understood that the present inventive concept should not be limited to the embodiments and may be modified in various ways.

In the drawings, to clearly and briefly explain the present inventive concept, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present inventive concept are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, an apparatus and method for attaching interconnectors for a solar cell panel according to an embodiment of the present inventive concept will be described with reference to the accompanying drawings. For clear description, a solar cell panel, which includes interconnectors attached by the apparatus and method for attaching interconnectors for the solar cell panel according to the present embodiment, will first be described, and thereafter, the apparatus and method for attaching interconnectors for the solar cell panel according to the present embodiment will be described. In the following description, the terms "first", "second", etc. are simply used in order to distinguish elements from each other, and the present inventive concept is not limited thereto.

Figure 2:
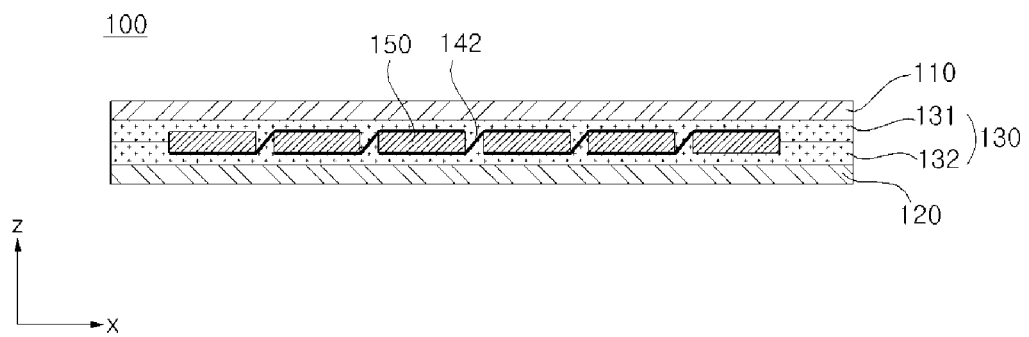
FIG. 2 is a sectional view taken along line II-II of FIG. 1.

FIG. 1 is a perspective view illustrating a solar cell panel according to an embodiment of the present inventive concept, and FIG. 2 is a sectional view taken along line II-II of FIG. 1.

Referring to FIGS. 1 and 2, the solar cell panel according to the present embodiment, designated by reference numeral 100, includes a plurality of solar cells 150 and interconnectors 142 for electrically interconnecting the solar cells 150. In addition, the solar cell panel 100 includes a sealing member 130 for surrounding and sealing the solar cells 150 and the interconnectors 142 for interconnecting the solar cells 150, a front substrate 110 disposed on the front surface of the solar cells 150 above the sealing member 130, and a back substrate 120 disposed on the back surface of the solar cells 150 above the sealing member 130. This will be described below in more detail.

First, each of the solar cells 150 may include a photoelectric converter for converting sunlight into electrical energy, and an electrode electrically connected to the photoelectric converter for collecting and transferring current. The solar cells 150 may be electrically interconnected in series and/or in parallel by the interconnectors 142. Specifically, the interconnectors 142 may electrically interconnect two neighboring solar cells 150 among the solar cells 150.

In addition, bus ribbons 145 interconnect alternate ends of the interconnectors 142, which interconnect the solar cells 150 in rows (in other words, solar cell strings). The bus ribbons 145 may be located on the ends of the solar cell strings so as to cross the solar cell strings. The bus ribbons 145 may interconnect the solar cell strings adjacent to each other, or may connect the solar cell string(s) to a junction box, which prevents the backflow of current. The material, shape, connection structure, and the like of the bus ribbons 145 may be altered in various ways, and the present inventive concept is not limited as to them.

The sealing member 130 may include a first sealing member 131 disposed on the front surface of the solar cells 150 interconnected by the interconnectors 142, and a second sealing member 132 disposed on the back surface of the solar cells 150. The first sealing member 131 and the second sealing member 132 prevent the introduction of moisture and oxygen, and realize a chemical bond between respective elements of the solar cell panel 100. The first and second sealing members 131 and 132 may be formed of an insulation material having light-transmissive and adhesive properties. In one example, the first sealing member 131 and the second sealing member 132 may be formed of ethylene vinyl acetate (EVA) copolymer resin, polyvinyl butyral, silicone resin, ester-based resin, or olefin-based resin. The back substrate 120, the second sealing member 132, the solar cells 150, the first sealing member 131, and the front substrate 110 may be integrated with one another so as to construct the solar cell panel 100 via, for example, a lamination process using the first and second sealing members 131 and 132.

The front substrate 110 is disposed on the first sealing member 131 and configures the front surface of the solar cell panel 100. The back substrate 120 is disposed on the second sealing member 132 and configures the back surface of the solar cell panel 100. Each of the front substrate 110 and the back substrate 120 may be formed of an insulation material capable of protecting the solar cells 150 from external shocks, moisture, ultraviolet light, and the like. In addition, the front substrate 110 may be formed of a light-transmitting material capable of transmitting light, and the back substrate 120 may be configured as a sheet formed of a light-transmitting material, a material not transmitting light, or a material reflecting light. In one example, the front substrate 110 may be configured as a glass substrate, and the back substrate 120 may be a Tedlar/PET/Tedlar (TPT) substrate, or may include a polyvinylidene fluoride (PVDF) resin layer formed on at least one surface of a base film (e.g. a polyethyleneterephthlate (PET) film).

However, the present inventive concept is not limited thereto. Thus, the first and second sealing members 131 and 132, the front substrate 110, or the back substrate 120 may include any of various materials excluding the above-described materials, and may have any of various shapes. For example, the front substrate 110 or the back substrate 120 may have any of various shapes (e.g. a substrate, film, or sheet), or may include any of various materials.

An example of the solar cells and the interconnectors connected thereto, which are included in the solar cell panel according to the embodiment of the present inventive concept, will be described below in more detail with reference to FIG. 3.

Figure 3:
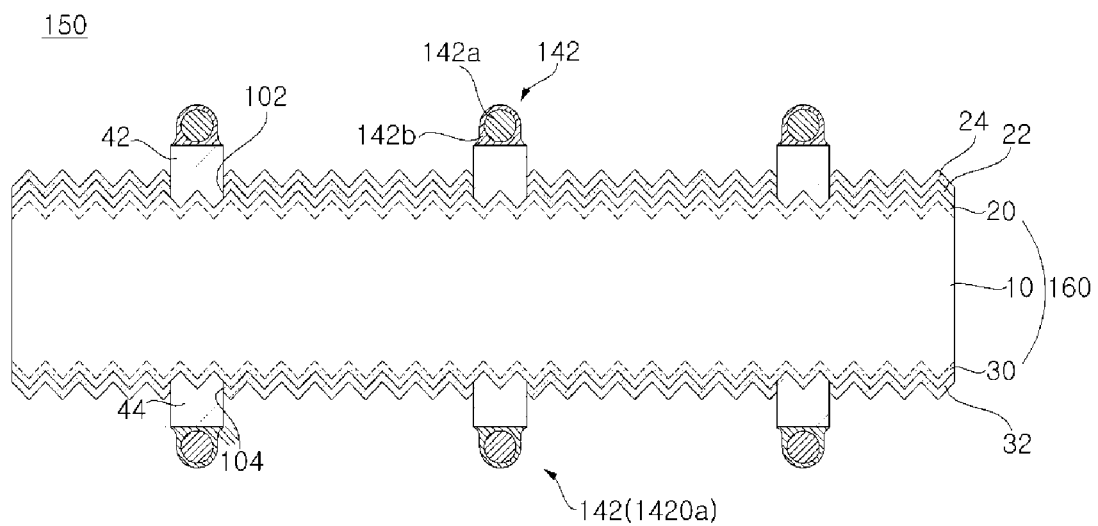
FIG. 3 is a partial sectional view illustrating an example of a solar cell and interconnectors connected thereto, which are included in the solar cell panel of FIG. 1.

FIG. 3 is a partial sectional view illustrating an example of the solar cells and the interconnectors connected thereto, which are included in the solar cell panel of FIG. 1.

Referring to FIG. 3, each solar cell 150 includes a semiconductor substrate 160, conductive areas 20 and 30 formed on or over the semiconductor substrate 160, and electrodes 42 and 44 connected to the conductive areas 20 and 30. The conductive areas 20 and 30 may include a first conductive area 20 of a first conductive type and a second conductive area 30 of a second conductive type. The electrodes 42 and 44 may include a first electrode 42 connected to the first conductive area 20, and a second electrode 44 connected to the second conductive area 30. The solar cell 150 may further include, for example, first and second passivation films 22 and 32, and an anti-reflection film 24.

The semiconductor substrate 160 may be formed of crystalline semiconductors including a single semiconductor material (e.g. group-IV elements). In one example, the semiconductor substrate 160 may be formed of monocrystalline or polycrystalline semiconductors (e.g. monocrystalline or polycrystalline silicon). More particularly, the semiconductor substrate 160 may be formed of monocrystalline semiconductors (e.g. a monocrystalline semiconductor wafer, and more specifically, a monocrystalline silicon wafer). As such, the solar cell 150 is based on the semiconductor substrate 160, which is formed of monocrystalline semiconductors having high crystallinity and thus low defects. Accordingly, the solar cell 150 may have excellent electrical properties.

The front surface and/or the back surface of the semiconductor substrate 160 may be subjected to texturing so as to have protrusions. The protrusions may take the form of pyramids having irregular sizes, and the outer surface of the protrusions may be (111) faces of the semiconductor substrate 160. When the roughness of the front surface of the semiconductor substrate 160 is increased by the protrusions formed on the front surface via texturing, the reflectance of light introduced through the front surface of the semiconductor substrate 160 may be reduced. Accordingly, the quantity of light, which reaches the pn junction formed by a base area 10 and the first or second conductive area 20 or 30, may be increased, which may minimize shading loss. The present embodiment illustrates that protrusions are formed on each of the front surface and the back surface of the semiconductor substrate 160. However, the present inventive concept is not limited thereto. Accordingly, protrusions may be formed on at least one of the back surface and the front surface of the semiconductor substrate 160, and may not be formed on the front surface and the back surface of the semiconductor substrate 160.

In the present embodiment, the semiconductor substrate 160 includes the base area 10, which includes a first or second conductive dopant at a relatively low doping density, thus being of a first or second conductive type. At this time, the base area 10 of the semiconductor substrate 160 may have a lower doping density, higher resistance, or lower carrier density than one of the first and second conductive areas 20 and 30, which is of the same conductive type as the base area 10. In one example, in the present embodiment, the base area 10 may be of a second conductive type.

In addition, the semiconductor substrate 160 may include the first conductive area 20 and the second conductive area 30. In the present embodiment, the base area 10 and the conductive areas 20 and 30, which constitute the semiconductor substrate 160, have the crystalline structure of the semiconductor substrate 160, are of different conductive types, and have different doping densities. For example, an area of the semiconductor substrate 160, which includes a first conductive dopant and thus is of a first conductive type, may be defined as the first conductive area 20, an area of the semiconductor substrate 160, which includes a second conductive dopant at a low doping density and thus is of a second conductive type, may be defined as the base area 10, and an area of the semiconductor substrate 160, which includes the second conductive dopant at a higher doping density than that in the base area 10 and thus is of the second conductive type, may be defined as the second conductive area 30.

The first and second conductive areas 20 and 30 may be formed respectively throughout the front surface and the back surface of the semiconductor substrate 160. In this instance, "formed throughout" includes not only a physically complete formation, but also a formation with inevitably excluded parts. In this way, the first and second conductive areas 20 and 30 may be formed to have a sufficient area without separate patterning.

The first conductive area 20 may configure an emitter area, which forms a pn junction with the base area 10. The second conductive area 30 may configure a back-surface field area, which forms a back-surface field. The back-surface field area serves to prevent the loss of carriers due to recombination on the surface of the semiconductor substrate 160 (more accurately, the back surface of the semiconductor substrate 160).

In the present embodiment, the conductive areas 20 and 30 are doped areas, which are formed by doping some inner areas of the semiconductor substrate 160 with dopants, thus constituting a portion of the semiconductor substrate 160. However, the present inventive concept is not limited thereto. Accordingly, at least one of the first conductive area 20 and the second conductive area 30 may be configured as an amorphous, microcrystalline or polycrystalline semiconductor layer, which is a separate layer over the semiconductor substrate 160. Various other alterations or modifications are possible or usable.

In addition, the present embodiment exemplifies that the first conductive area 20 and the second conductive area 30 have a homogeneous structure having a uniform doping density. However, the present inventive concept is not limited thereto. Thus, in another embodiment, at least one of the first conductive area 20 and the second conductive area 30 may have a selective structure. In the selective structure, a portion of the conductive areas 20 and 30 proximate to the electrodes 42 and 44 may have a high doping density and low resistance, and the remaining portion may have a low doping density and high resistance. In another embodiment, the second conductive area 30 may have a local structure. In the local structure, the second conductive area 30 may be locally formed so as to correspond to a portion at which the second electrode 44 is formed.

The first conductive dopant, included in the first conductive area 20, may be an n-type or p-type dopant, and the second conductive dopant, included in the base area 10 and the second conductive area 30, may be a p-type or n-type dopant. The p-type dopant may be a group-III element, such as boron (B), aluminum (Al), gallium (ga), or indium (In), and the n-type dopant may be a group-V element, such as phosphorus (P), arsenic (As), bismuth (Bi), or antimony (Sb). The second conductive dopant in the base area 10 and the second conductive dopant in the second conductive area 30 may be the same material, or may be different materials.

In one example, the first conductive area 20 may be of a p-type, and the base area 10 and the second conductive area 30 may be of an n-type. When light is emitted to the pn junction formed by the first conductive area 20 and the base area 10, electrons generated by photoelectric conversion move to the back surface of the semiconductor substrate 160 to thereby be collected by the second electrode 44, and holes move to the front surface of the semiconductor substrate 160 to thereby be collected by the first electrode 42. Thereby, electricity is generated. When holes, which move more slowly than electrons, move to the front surface of the semiconductor substrate 160, rather than the back surface, the conversion efficiency may be improved. However, the present inventive concept is not limited thereto, and the base area 10 and the second conductive area 30 may be of a p-type, and the first conductive area 20 may be of an n-type.

Insulation films, such as, for example, the first and second passivation films 22 and 32 and the anti-reflection film 24, may be formed over the surfaces of the semiconductor substrate 160. The insulation films may be configured as undoped insulation films, which include no dopant.

More specifically, the first passivation film 22 may be formed over (e.g. in contact with) the front surface of the semiconductor substrate 160, more accurately, over the first conductive area 20 formed on the semiconductor substrate 160, and the anti-reflection film 24 may be formed over (e.g. in contact with) the first passivation film 22. In addition, the second passivation film 32 may be formed over (e.g. in contact with) the back surface of the semiconductor substrate 160, more accurately, over the second conductive area 30 formed on the semiconductor substrate 160.

The first passivation film 22 and the anti-reflection film 24 may be formed substantially throughout the front surface of the semiconductor substrate 160 excluding a portion corresponding to the first electrode 42 (more accurately, a portion provided with a first opening 102). Similarly, the second passivation film 32 may be formed substantially throughout the back surface of the semiconductor substrate 160 excluding a portion corresponding to the second electrode 44 (more accurately, a portion provided with a second opening 104).

The first and second passivation films 22 and 32 come into contact with the first and second conductive areas 20 and 30 for passivation of defects present in the surface or the bulk of the conductive areas 20 and 30. As such, it is possible to increase the open-circuit voltage Voc of the solar cell 150 by removing recombination sites of minority carriers. The anti-reflection film 24 reduces the reflectance of light introduced into the front surface of the semiconductor substrate 160. This may increase the quantity of light, which reaches the pn junction formed at the interface of the base area 10 and the first conductive area 20. Thereby, the short-circuit current Isc of the solar cell 150 may be increased. In conclusion, the passivation films 22 and 32 and the anti-reflection film 24 may increase the open-circuit voltage and the short-circuit current of the solar cell 150, thereby improving the efficiency of the solar cell 150.

In one example, the passivation films 22 and 32 or the anti-reflection film 24 may include a single film or multiple films in the form of a combination of two or more films selected from the group consisting of a silicon nitride film, silicon nitride film containing hydrogen, silicon oxide film, silicon oxide nitride film, aluminum oxide film, $MgF_2$, ZnS, $TiO_2$, and $CeO_2$. In one example, the first or second passivation film 22 or 32 may include a silicon oxide film or silicon nitride film having a fixed positive charge when the conductive area 20 or 30 is of an n-type, and may include an aluminum oxide film having a fixed negative charge when the conductive area 20 or 30 is of a p-type. In one example, the anti-reflection film 24 may include a silicon nitride.

However, the present inventive concept is not limited thereto, and the passivation films 22 and 32 and the anti-reflection film 24 may include various materials. In addition, the stacking structure of the insulation films stacked over the front surface and/or the back surface of the semiconductor substrate 160 may be altered in various ways. For example, the insulation films may be stacked one above another in a stacking sequence different from the above-described stacking sequence. Alternatively, at least one of the first and second passivation films 22 and 32 and the anti-reflection film 24 may be omitted, or other insulation films excluding the first and second passivation films 22 and 32 and the anti-reflection film 24 may be provided. Various other alterations or modifications are possible or usable.

The first electrode 42 is electrically connected to the first conductive area 20 through the first opening 102, which is formed in the insulation films disposed on the front surface of the semiconductor substrate 160 (e.g. the first passivation film 22 and the anti-reflection film 24). The second electrode 44 is electrically connected to the second conductive area 30 through the second opening 104, which is formed in the insulation film disposed on the back surface of the semiconductor substrate 160 (e.g. the second passivation film 32). In one example, the first electrode 42 may come into contact with the first conductive area 20, and the second electrode 44 may come into contact with the second conductive area 30.

The first and second electrodes 42 and 44 may be formed of various materials (e.g. metal materials) so as to have various shapes. The shapes of the first and second electrodes 42 and 44 will be described later.

As such, in the present embodiment, the first and second electrodes 42 of the solar cell 150 may have a predetermined pattern so that the solar cell 150 has a bi-facial structure to allow light to be introduced into the front surface and the back surface of the semiconductor substrate 160. Thereby, the quantity of light used in the solar cell 150 may be increased, which may contribute to improvement in the efficiency of the solar cell 150.

However, the present inventive concept is not limited thereto, and the second electrode 44 may be formed throughout the back surface of the semiconductor substrate 160. In addition, all of the first and second conductive areas 20 and 30 and the first and second electrodes 42 and 44 may be arranged on the same surface (e.g. the back surface) of the semiconductor substrate 160, or at least one of the first and second conductive areas 20 and 30 may be formed over both the surfaces of the semiconductor substrate 160. That is, the above-described solar cell 150 is given by way of example, and the present inventive concept is not limited thereto.

The solar cell 150 described above is electrically connected to a neighboring solar cell 150 by the interconnector 142, which is located over (e.g. in contact with) the first electrode 42 or the second electrode 44. This will be described below in more detail with reference to FIGS. 1 to 3 and FIG. 4.

Figure 4:
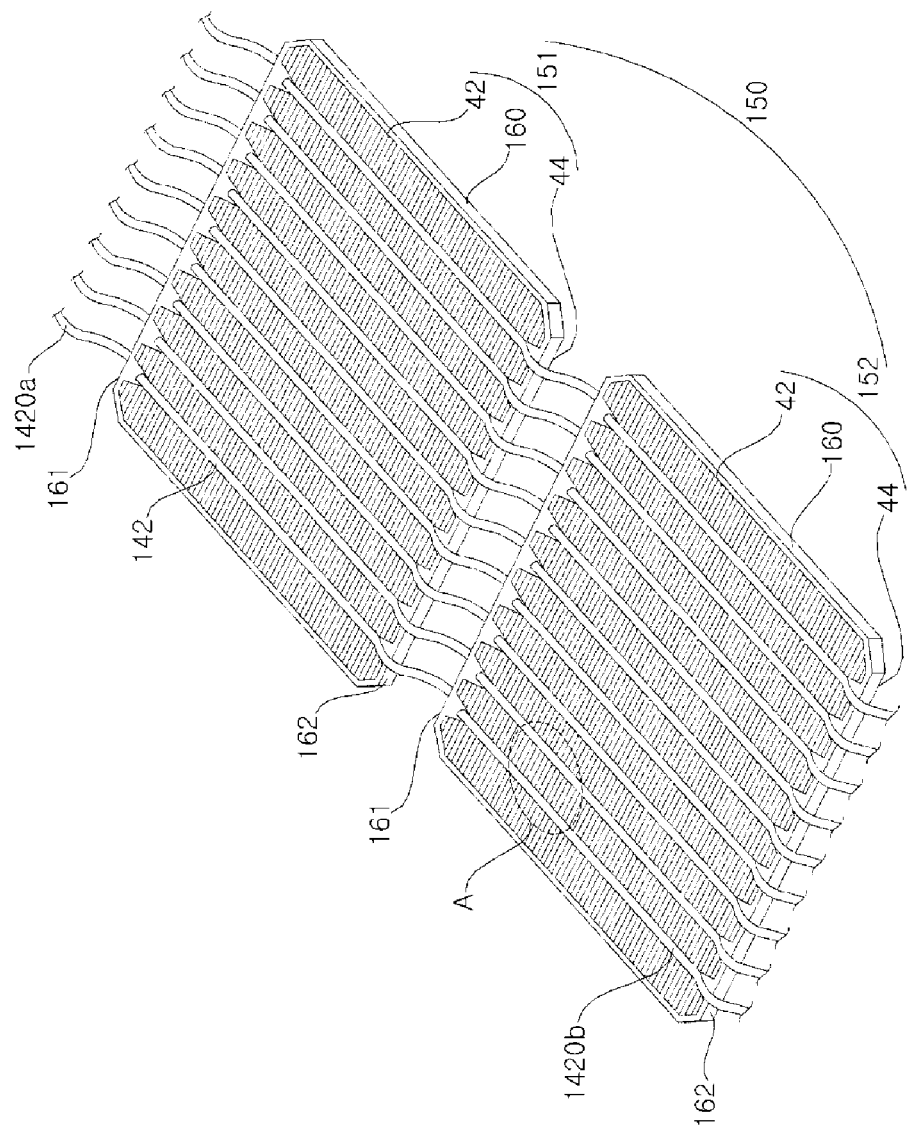
FIG. 4 is a perspective view schematically illustrating a first solar cell and a second solar cell, which are included in the solar cell panel of FIG. 1 and are interconnected via interconnectors.

FIG. 4 is a perspective view schematically illustrating a first solar cell 151 and a second solar cell 152, which are included in the solar cell panel 100 of FIG. 1 and are interconnected via the interconnector 142. In FIG. 4, the first and second solar cells 151 and 152 are schematically illustrated, and the illustration is focused on the semiconductor substrate 160 and the electrodes 42 and 44.

As illustrated in FIG. 4, two neighboring solar cells 150 (e.g. the first solar cell 151 and the second solar cell 152) among the solar cells 150 may be interconnected by the interconnector 142. At this time, the interconnector 142 interconnects the first electrode 42, which is disposed on the front surface of the first solar cell 151, and the second electrode 44, which is disposed on the back surface of the second solar cell 152, which is located on one side (the left lower side in FIG. 4) of the first solar cell 151. In addition, another interconnector 1420a interconnects the second electrode 44, which is disposed on the back surface of the first solar cell 151, and the first electrode 42, which is disposed on the front surface of another solar cell, which may be located on the other side (the right upper side in FIG. 4) of the first solar cell 151. In addition, another interconnector 1420b interconnects the first electrode 42, which is disposed on the front surface of the second solar cell 152, and the second electrode 44, which is disposed on the back surface of another solar cell, which may be located on one side (the left lower side in FIG. 4) of the second solar cell 152. In this way, the multiple solar cells 150 may be interconnected to form a single row by the interconnectors 142, 1420a and 1420b. A following description related to the interconnector 142 may be applied to all of the interconnectors 142, 1420a and 1420b, each of which interconnects two neighboring solar cells 150.

In the present embodiment, the interconnector 142 may include a first portion, a second portion, and a third portion. The first portion is connected to the first electrode 42 (more specifically, a bus-bar line (see reference numeral 42b in FIG. 5) of the first electrode 42) on the front surface of the first solar cell 151 and extends a long length from a first edge 161 to a second edge 162, which is opposite the first edge 161. The second portion is connected to the second electrode 44 (more specifically, a bus-bar line of the second electrode 44) on the back surface of the second solar cell 152 and extends a long length from the first edge 161 to the second edge 162, which is opposite the first edge 161. The third portion extends from the front surface of the second edge 162 of the first solar cell 151 to the back surface of the second solar cell 152 so as to connect the first portion and the second portion to each other. As such, the interconnector 142 may cross a portion of the first solar cell 151, and then may cross a portion of the second solar cell 152. When the interconnector 142 has a width smaller than the first and second solar cells 151 and 152 and is formed so as to correspond to the aforementioned portions of the first and second solar cells 151 and 152 (e.g. the bus-bar line 42b), the interconnector 142 may effectively interconnect the first and second solar cells 151 and 152 despite a small area thereof.

In one example, the interconnector 142 may come into contact with the bus-bar line 42b of the first and second electrodes 42 and 44 so as to extend a long length along the bus-bar line 42b. Thereby, the interconnector 142 and the first and second electrodes 42 and 44 may continuously come into contact with each other, which may improve electrical properties. However, the present inventive concept is not limited thereto. The first electrode 42 may have no bus-bar line 42b, and in this instance, the interconnector 142 may be in contact with and be connected to a plurality of finger lines (see reference numeral 42a in FIG. 5) so as to cross the finger lines 42a. However, the present inventive concept is not limited thereto.

When viewing one surface of each solar cell 150, the multiple interconnectors 142 may be provided to improve the electrical connection between neighboring solar cells 150. In particular, in the present embodiment, the interconnector 142 is configured as a wire, which has a width smaller than a conventional ribbon having a relatively large width (e.g. within a range from 1 mm to 2 mm). As such, a greater number of interconnectors 142 than the conventional ribbons (e.g. two to five interconnectors) are used on one surface of each solar cell 150.

In one example, each interconnector 142 may include a core layer 142a, which is formed of a metal, and a solder layer 142b, which is coated over the surface of the core layer 142a at a small thickness and includes a solder material so as to enable soldering with the electrodes 42 and 44. In one example, the core layer 142a may include Ni, Cu, Ag or Al as a main material (i.e. a material included in an amount of 50 weight percent or more, more specifically, 90 weight percent or more). The solder layer 142b may include, for example, Pb, Sn, SnIn, SnBi, SnPb, SnPbAg, SnCuAg or SnCu as a main material. However, the present inventive concept is not limited thereto, and the core layer 142a and the solder layer 142b may include various other materials.

When the wire, which has a width smaller than the conventional ribbon, is used as the interconnector 142, material costs may be considerably reduced. In addition, because the interconnector 142 has a width smaller than the ribbon, a sufficient number of interconnector 142 may be provided to minimize the movement distance of carriers, which may enhance the output of the solar cell panel 100.

In addition, the wire, which configures the interconnector 142 according to the present embodiment, may include a rounded portion. That is, the wire, which configures the interconnector 142, may have a circular, oval, or curvilinear cross section, or a rounded cross section. Thereby, the wire, which configures the interconnector 142, may cause reflection or diffused reflection. In this way, light reflected from the rounded surface of the wire, which configures the interconnector 142, may be reflected or totally reflected by the front substrate 110 or the back substrate 120, which is disposed on the front surface or the back surface of the solar cell 150, to thereby be reintroduced into the solar cell 150. This may effectively enhance the output of the solar cell panel 100. However, the present inventive concept is not limited thereto. Accordingly, the wire, which configures the interconnector 142, may have a polygonal shape, such as a rectangular shape, or may have any of various other shapes.

In the present embodiment, the width (or the diameter) of the interconnector 142 may range from 250 μm to 500 μm. For reference, in the present embodiment, because the thickness of the solder layer 142b may be very small and may have any of various values depending on the position of the interconnector 142, the width of the interconnector 142 may be the width of the core layer 142a. Alternatively, the width of the interconnector 142 may be the width that is measured at the center of the interconnector 142 above a line portion (see reference numeral 421 in FIG. 5). The interconnector 142, which has the above-described width and takes the form of a wire, may efficiently transfer current, generated in the solar cell 150, to an external circuit (e.g. a bus ribbon or a bypass diode of a junction box) or another solar cell 150. In the present embodiment, the interconnectors 142 may be individually positioned over and fixed to the electrodes 42 and 44 of the solar cell 150 without being inserted into, for example, a separate layer or film. When the width of the interconnector 142 is below 250 μm, the strength of the interconnector 142 may be insufficient and the connection area between the interconnector 142 and the electrodes 42 and 44 may be very small, which may result in poor electrical connection and low attachment force. When the width of the interconnector 142 exceeds 500 μm, the cost of the interconnector 142 may increase, and the interconnector 142 may prevent light from being introduced into the front surface of the solar cell 150, thereby increasing shading loss. In addition, the interconnector 142 may receive force so as to be spaced apart from the electrodes 42 and 44, which may cause low attachment force between the interconnector 142 and the electrodes 42 and 44 and may generate cracks in the electrodes 42 and 44 or the semiconductor substrate 160. In one example, the width of the interconnector 142 may range from 350 μm to 450 μm (more particularly, from 350 μm to 400 μm). With this range, the interconnector 142 may achieve increased attachment force for the electrodes 42 and 44 and may enhance the output of the solar cell 150.

At this time, six to thirty-three interconnectors 142 may be provided on one surface of the solar cell 150. More specifically, when the width of the interconnectors 142 is 250 μm or more and below 300 μm, the number of interconnectors 142 may range from 15 to 33. When the width of the interconnectors 142 is 300 μm or more and below 350 μm, the number of interconnectors 142 may range from 10 to 33. When the width of the interconnectors 142 is 350 μm or more and below 400 μm, the number of interconnectors 142 may range from 8 to 33. When the width of the interconnectors 142 ranges from 400 μm to 500 μm, the number of interconnectors 142 may range from 6 to 33. In addition, when the width of the interconnectors 142 is 350 μm or more, the output of the solar cell panel 100 is no longer increased even if the number of interconnectors 142 exceeds 15. In addition, when the number of interconnectors 142 increases, this may increase the burden on the solar cell 150. In consideration of this, when the width of the interconnectors 142 is 350 μm or more and below 400 μm, the number of interconnectors 142 may range from 8 to 15. When the width of the interconnectors 142 ranges from 400 μm to 500 μm, the number of interconnectors 142 may range from 6 to 15. At this time, in order to further enhance the output of the solar cell panel 100, the number of interconnectors 142 may be 10 or more (e.g. 12 or 13). However, the present inventive concept is not limited thereto, and the number of interconnectors 142 and the number of bus-bar lines 42b may have various other values.

At this time, the pitch of the interconnectors 142 (or the pitch of the bus-bar lines 42b) may range from 4.75 mm to 26.13 mm. This is acquired in consideration of the width and the number of interconnectors 142. For example, when the width of the interconnectors 142 is 250 μm or more and below 300 μm, the pitch of the interconnectors 142 may range from 4.75 mm to 10.45 mm. When the width of the interconnectors 142 is 300 μm or more and below 350 μm, the pitch of the interconnectors 142 may range from 4.75 mm to 15.68 mm. When the width W of the interconnectors 142 is 350 μm or more and below 400 μm, the pitch of the interconnectors 142 may range from 4.75 mm to 19.59 mm. When the width of the interconnectors 142 ranges from 400 μm to 500 μm, the pitch of the interconnectors 142 may range from 4.75 mm to 26.13 mm. More specifically, when the width of the interconnectors 142 is 350 μm or more and below 400 μm, the pitch of the interconnectors 142 may range from 10.45 mm to 19.59 mm. When the width of the interconnectors 142 ranges from 400 μm to 500 μm, the pitch of the interconnectors 142 may range from 10.45 mm to 26.13 mm. However, the present inventive concept is not limited thereto, and the pitch of the interconnectors 142 and the pitch of the bus-bar lines 42b may have various other values.

In the present embodiment, the first electrode 42 (or the second electrode 44), the interconnector 142, and an electrode area (see reference character EA in FIG. 5) may be symmetrically arranged in the first direction (i.e. the direction parallel to the finger lines 42a) and the second direction (i.e. the direction parallel to the bus-bar lines 42b or the interconnectors 142). Thereby, the flow of current may be stabilized. However, the present inventive concept is not limited thereto.

An example of the electrodes 42 and 44 of the solar cell 150, to which the interconnectors 142 according to the embodiment of the present inventive concept may be attached, will be described below in detail with reference to FIGS. 1 to 4 and FIG. 5. Hereinafter, the first electrode 42 will be described in detail with reference to FIG. 5, and then the second electrode 44 will be described.

Figure 5:
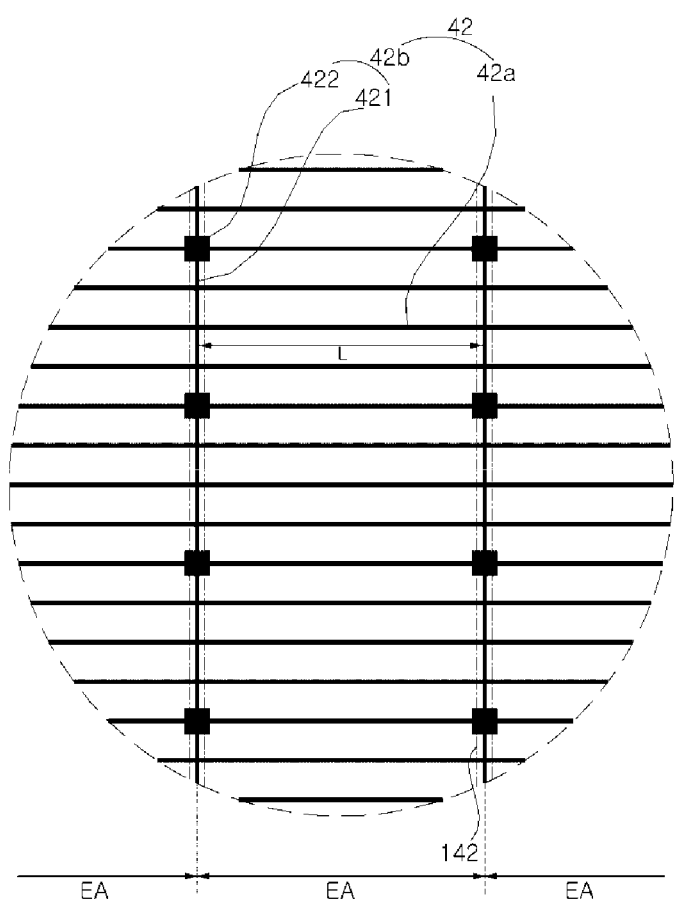
FIG. 5 is a partial plan view of portion A of FIG. 4 in an enlarged scale.

FIG. 5 is a partial plan view illustrating portion A of FIG. 4 in an enlarged scale.

Referring to FIGS. 1 to 5, in the present embodiment, the first electrode 42 includes the finger lines 42a, which extend in the first direction (i.e. the horizontal direction in the drawings) and are arranged parallel to each other. The first electrode 42 may further include the bus-bar lines 42b, which extend in the second direction (i.e. the vertical direction in the drawings) crossing (e.g. perpendicular to) the finger lines 42a and are connected or attached to the interconnectors 142. Because the bus-bar lines 42b may be arranged so as to correspond to the interconnectors 142, the description related to the number and the pitch of the interconnectors 142 may be directly applied to the number and the pitch of the bus-bar lines 42b. Hereinafter, an area between two neighboring bus-bar lines 42b among the bus-bar lines 42b is referred to as the electrode area EA. In the present embodiment, because the multiple (e.g. six or more) interconnectors 142 are provided on one surface of the solar cell 150, a plurality of electrode areas EA (provided in the number greater than the number of interconnectors 142 by one) may be provided.

The finger lines 42a may have a consistent width, and may be spaced apart from one another at a consistent pitch. Although FIG. 5 illustrates that the finger lines 42a are formed parallel to each other in the first direction and are parallel to the main edges (more particularly, the first and second edges 161 and 162) of the solar cell 150, the present inventive concept is not limited thereto.

In one example, the finger lines 42a of the first electrode 42 may have the width ranging from 35 µm to 120 µm and may have the pitch ranging from 1.2 mm to 2.8 mm, and the number of finger lines 42a may range from 55 to 130 in the direction crossing the finger lines 42a. The width and the pitch of the finger lines 42a may be determined based on easy process conditions, and may be limited to minimize shading loss due to the finger lines 42a while ensuring the effective collection of current generated via photoelectric conversion. The thickness of the finger lines 42a may be within the range in which the finger lines 42a may be formed via an easy process and may have a desired specific resistance. However, the present inventive concept is not limited thereto, and the width and the pitch of the finger lines 42a may be changed in various ways depending on, for example, variation in process conditions, the size of the solar cell 150, and the constituent material of the finger lines 42a.

At this time, the width of the interconnectors 142 may be smaller than the pitch of the finger lines 42a, and may be greater than the width of the finger lines 42a. However, the present inventive concept is not limited thereto, and various alterations or modifications are possible or usable.

In one example, the bus-bar lines 42b may be successively formed from the position proximate to the first edge 161 to the position proximate to the second edge 162 in the electrode area EA. As mentioned above, the bus-bar lines 42b may be located so as to correspond to the interconnectors 142, which are used to connect the respective neighboring solar cells 150. The bus-bar lines 42b may correspond to the interconnectors 142 in a one-to-one ratio. As such, in the present embodiment, the number of bus-bar-lines 42b may be the same as the number of interconnectors 142 on one surface of the solar cell 150.

Each bus-bar line 42b may include a line portion 421, which has a relatively small width and extends a long length in the direction in which it is connected to the interconnector 142 within the electrode area EA, and a pad portion 422, which has a width greater than the line portion 421 so as to increase the area of connection for the interconnector 142. The line portion 421 having a small width may minimize the area by which light is blocked so as not to be introduced into the solar cell 150, and the pad portion 422 having a large width may increase the attachment force between the interconnector 142 and the bus-bar line 42b and may reduce contact resistance. The pad portion 422 has a width greater than the line portion 421, and thus substantially serves as a portion for the attachment of the interconnector 142. The interconnector 142 may be attached to the line portion 421, or may be simply placed on the line portion 421 without being attached thereto.

The width of the pad portion 422, measured in the first direction, may be greater than the width of each of the line portion 421 and the finger line 42a.

The present embodiment illustrates that the line portion 421 of the bus-bar line 42b is provided so as to correspond to the interconnector 142. More specifically, although a bus-bar electrode, which is significantly wider than the finger line 42a, is provided to correspond to the interconnector 142 in the related art, in the present embodiment, the line portion 421 of the bus-bar line 42b, which has a width significantly smaller than the bus-bar electrode, is provided. In the present embodiment, the line portion 421 may connect the finger lines 42a to one another so as to provide a bypass path for carriers when some finger lines 42a are disconnected.

In this specification, the bus-bar electrode refers to an electrode portion, which is formed in the direction crossing the finger lines so as to correspond to the interconnector 142 and has a width twelve times or more (usually, fifteen times or more) the width of the finger lines. Two or three bus-bar electrodes are usually provided because the bus-bar electrodes have a relatively large width. In addition, in the present embodiment, the line portion 421 of the bus-bar line 42b may refer to an electrode portion, which is formed in the direction crossing the finger lines 42a so as to correspond to the interconnector 142 and has a width ten times or less the width of the finger line 42a.

In one example, the width of the line portion 421 may range from 0.5 times to 10 times the width of the finger line 42a. When the ratio is below 0.5 times, the width of the line portion 421 may be too small to allow the line portion 421 to exert sufficient effects. When the ratio exceeds 10 times, the width of the line portion 421 may be excessive, causing increased shading loss. In particular, in the present embodiment, because a great number of interconnectors 142 are provided, the line portions 421 are also provided in a great number, which may further increase shading loss. More specifically, the width of the line portion 421 may range from 0.5 times to 7 times the width of the finger line 42a. When the ratio is 7 times or less, shading loss may further be reduced. In one example, in terms of shading loss, the width of the line portion 421 may range from 0.5 times to 4 times the width of the finger line 42a. More specifically, the width of the line portion 421 may range from 0.5 times to 2 times the width of the finger line 42a. With this range, the efficiency of the solar cell 150 may be greatly increased.

Alternatively, the width of the line portion 421 may be equal to or smaller than the width of the interconnector 142. This is because the width or area by which the lower surface of the interconnector 142 comes into contact with the line portion 421 is not large when the interconnector 142 has a circular, oval or rounded shape. When the line portion 421 has a relatively small width, the area of the first electrode 42 may be reduced, resulting in a reduction in the manufacturing costs of the first electrode 42.

In one example, the ratio of the width of the interconnector 142 to the width of the line portion 421 may be greater than 1:0.07 and less than 1:1. When the ratio is below 1:0.07, the width of the line portion 421 is excessively small, causing deterioration in electrical properties. When the ratio exceeds 1, the area of the first electrode 42 is increased, causing increased shading loss and material costs without considerable improvement in the contact between the interconnector 142 and the line portion 421. In one example, the ratio may range from 1:01 to 1:0.5 (more specifically, from 1:0.1 to 1:0.3) when further considering the shading loss and the material costs.

Alternatively, the width of the line portion 421 may range from 30 µm to 350 µm. When the width of the line portion 421 is below 35 µm, the width of the line portion 421 is excessively small, causing deterioration in electrical properties. When the width of the line portion 421 exceeds 350 µm, the area of the first electrode 42 is excessive, causing increased shading loss and material costs without considerable improvement in the contact between the interconnector 142 and the line portion 421. In one example, the width of the line portion 421 may range from 35 µm to 200 µm (more specifically, from 35 µm to 120 µm) when further considering the shading loss and the material costs.

However, the present inventive concept is not limited thereto. Accordingly, the width of the line portion 421 may be changed in various ways within the range in which the line portion 421 effectively transfers current generated via photoelectric conversion and minimizes shading loss.

In addition, the width of the pad portion 422 may be greater than the width of the line portion 421, and may be equal to or greater than the width of the interconnector 142. Because the pad portion 422 serves to increase force for the attachment of the interconnector 142 by increasing the contact area of the interconnector 142, the width of the pad portion 422 may be greater than the width of the line portion 421, and may be equal to or greater than the width of the interconnector 142.

In one example, the ratio of the width of the interconnector 142 to the width of the pad portion 422 may range from 1:1 to 1:5. When the ratio is below 1:1, the width of the pad portion 422 may be insufficient, causing insufficient attachment force between the pad portion 422 and the interconnector 142. When the ratio exceeds 1:5, the area by which the pad portion 422 causes shading loss may be increased, resulting in greater shading loss. The ratio may range from 1:2 to 1:4 (more specifically, 1:2.5 to 1:4) when further considering the attachment force and the shading loss.

Alternatively, in one example, the width of the pad portion 422 may range from 0.25 mm to 2.5 mm. When the width of the pad portion 422 is below 0.25 mm, the contact area between the pad portion 422 and the interconnector 142 may be insufficient, and consequently, the attachment force between the pad portion 422 and the interconnector 142 may be insufficient. When the width of the pad portion 422 exceeds 2.5 mm, the area by which the pad portion 422 causes shading loss may be increased, resulting in greater shading loss. In one example, the width of the pad portion 422 may range from 0.8 mm to 1.5 mm.

In addition, the length of the pad portion 422 may be greater than the width of the finger line 42a. For example, the length of the pad portion 422 may range from 0.035 mm to 30 mm. When the length of the pad portion 422 is below 0.035 mm, the contact area between the pad portion 422 and the interconnector 142 may be insufficient, and consequently, the attachment force between the pad portion 422 and the interconnector 142 may be insufficient. When the length of the pad portion 422 exceeds 30 mm, the area by which the pad portion 422 causes shading loss may be increased, resulting in greater shading loss.

Alternatively, in one example, the ratio of the width of the finger line 42a to the length of the pad portion 422 may range from 1:1.1 to 1:20. With this range, the area for attachment between the pad portion 422 and the interconnector 142 may be increased, and consequently, the attachment force between the pad portion 422 and the interconnector 142 may be increased.

Alternatively, in one example, the ratio of the width of the interconnector 142 to the length of the pad portion 422 may range from 1:1 to 1:10. When the ratio is below 1:1, the length of the pad portion 422 may be insufficient, causing insufficient attachment force between the pad portion 422 and the interconnector 142. When the ratio exceeds 1:10, the area by which the pad portion 422 causes shading loss may be increased, resulting in greater shading loss. The ratio may range from 1:3 to 1:6 when further considering the attachment force and the shading loss.

One bus-bar line 42b may include six to twenty-four pad portions 422 (e.g. twelve to twenty-two pad portions). The pad portions 422 may be spaced apart from one another. In one example, one pad portion 422 may be allotted to two to ten finger lines 42a. Thereby, the portion in which the contact area between the bus-bar line 42b and the interconnector 142 is increased is provided at a regular interval so as to increase the attachment force between the bus-bar line 42b and the interconnector 142. Alternatively, the pad portions 422 may be arranged so that distances between the respective two pad portions 422 have different values. In particular, the pad portions 422 may be arranged at a high density on the end of the bus-bar line 42b, to which greater force is applied than in the other portion (i.e. the central portion of the bus-bar line 42b). Various other alterations or modifications are possible or usable.

The above description has been focused on the first electrode 42 with reference to FIG. 5. The second electrode 44 may include finger lines and bus-bar lines, which correspond respectively to the finger lines 42a and the bus-bar lines 42b of the first electrode 42. The description related to the finger lines 42a and the bus-bar lines 42b of the first electrode 42 may be applied to the finger lines and the bus-bar lines of the second electrode 44. At this time, the description of the first conductive area 20 in relation to the first electrode 42 may be the same as the description of the second conductive area 30 in relation to the second electrode 44. In addition, the description of the first passivation film 22, the anti-reflection film 24 and the opening 102 in relation to the first electrode 42 may be the description of the second passivation film 32 and the opening 104 in relation to the second electrode 44.

At this time, the widths, the pitch, and the number of finger lines 42a of the first electrode 42 and the line portion 421 and the pad portion 422 of each bus-bar line 42b may be equal to the widths, the pitch, and the number of finger lines of the second electrode 44 and the line portion and the pad portion of each bus-bar line. Alternatively, the widths, the pitch, and the number of finger lines 42a of the first electrode 42 and the line portion 421 and the pad portion 422 of each bus-bar line 42b may differ from the widths, the pitch, and the number of finger lines of the second electrode 44 and the line portion and the pad portion of each bus-bar line. In one example, the electrode portion of the second electrode 44, into which a relatively small amount of light is introduced, may have a width greater than the width of the electrode portion of the first electrode 42 corresponding thereto, and the pitch between the finger lines of the second electrode 44 may be less than the pitch of the finger lines 42a of the first electrode 42 corresponding thereto. Various other alterations or modifications are possible or usable. However, the number and the pitch of the bus-bar lines 42b of the first electrode 42 may be the same as to the number and the pitch of the bus-bar lines of the second electrode 44. In addition, the first electrode 42 and the second electrode 44 may have different planar shapes. For example, the second electrode 44 may be formed throughout the back surface of the semiconductor substrate 160. Various other alterations or modifications are possible or usable.

According to the present embodiment, shading loss due to, for example, diffused reflection may be minimized through the use of the interconnector 142 in the form of a wire, and the movement path of carriers may be reduced by increasing the number of interconnectors 142 and reducing the pitch of the interconnectors 142. Thereby, the efficiency of the solar cell 150 and the output of the solar cell panel 100 may be enhanced. As described above, a great number of the interconnectors 142, which takes the form of a wire that has, for example, a circular cross-sectional shape and a small width, may be attached to the solar cell 150. Accordingly, there is a demand for an interconnector attachment apparatus, which may attach the interconnector 142 to the solar cell 150 with high attachment force despite a wire shape thereof and may attach a great number of the interconnectors 142 at the same time so as to enhance productivity. An interconnector attachment apparatus and an interconnector attachment method using the same according to the present embodiment will be described in detail with reference to FIGS. 6 to 11 and FIGS. 12A to 12G.

Figure 6:
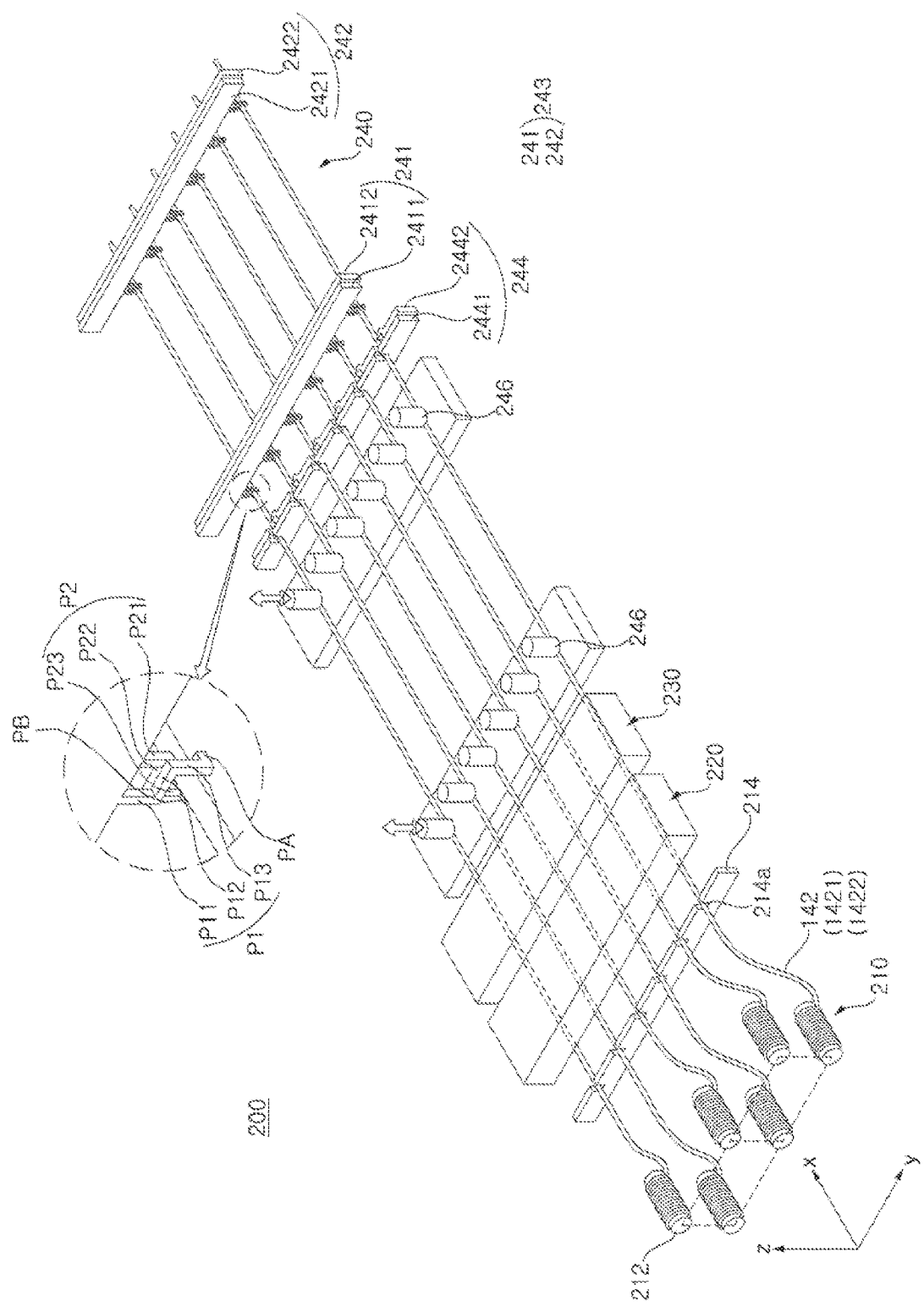
FIG. 6 is a view schematically illustrating the configuration of a portion of an interconnector attachment apparatus for a solar cell panel according to an embodiment of the present inventive concept.
Figure 7:
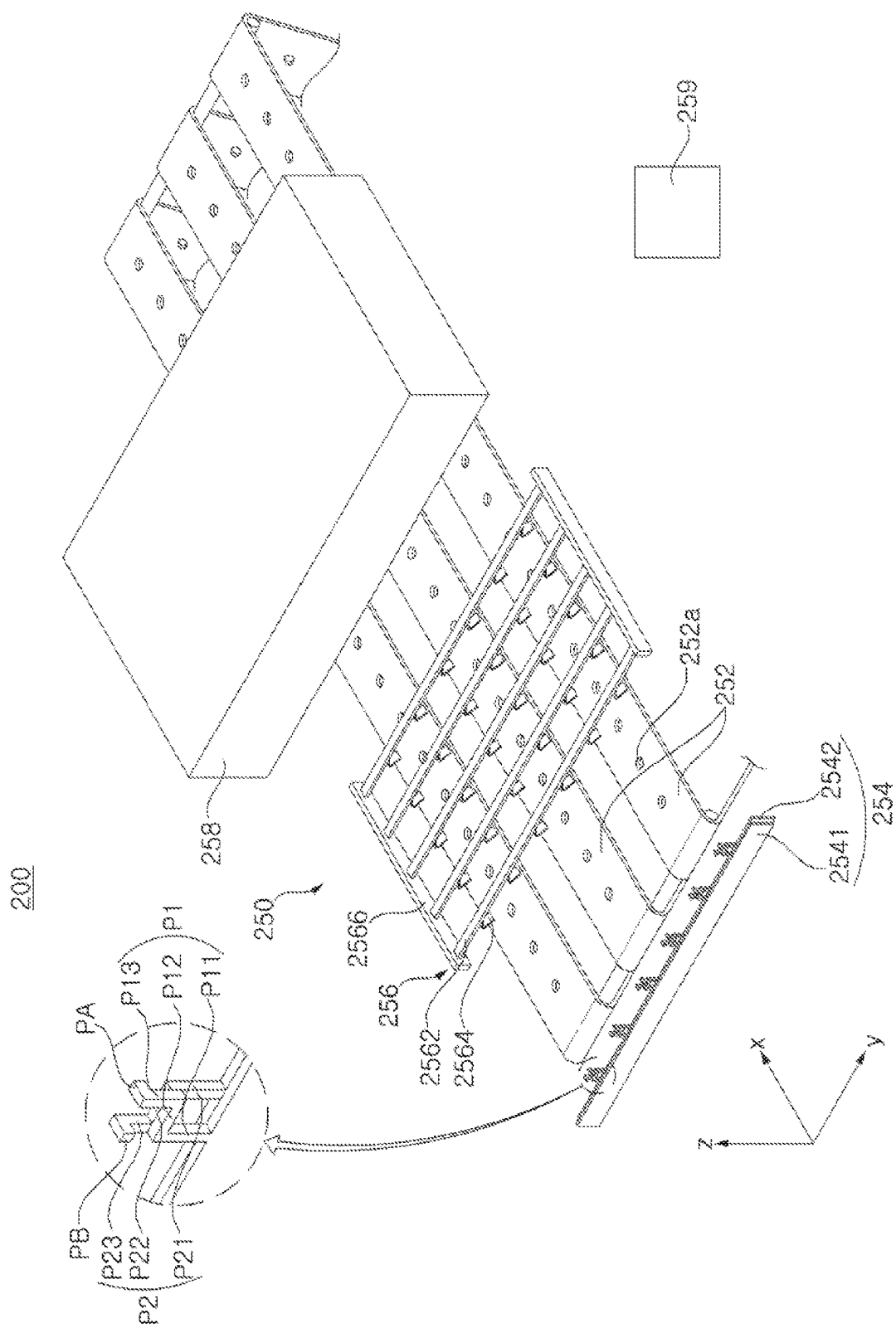
FIG. 7 is a view schematically illustrating the configuration of another portion of the interconnector attachment apparatus for the solar cell panel according to the embodiment of the present inventive concept.
Figure 8:
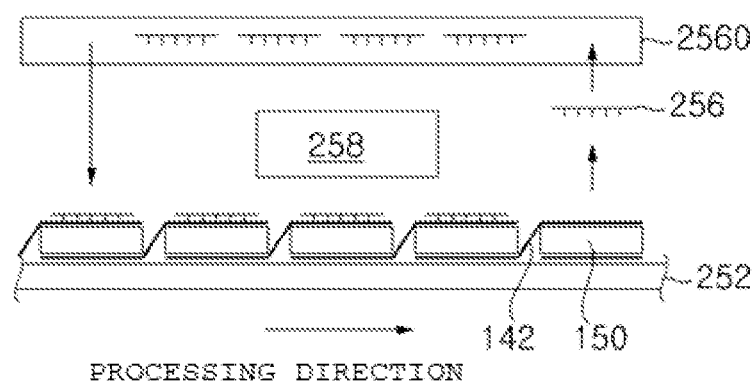
FIG. 8 is a conceptual view schematically illustrating a working table, a heat source, and an upper fixing member supply unit of the interconnector attachment apparatus for the solar cell panel according to the embodiment of the present inventive concept.

FIG. 6 is a view schematically illustrating the configuration of a portion of an interconnector attachment apparatus for a solar cell panel according to an embodiment of the present inventive concept. FIG. 7 is a view schematically illustrating the configuration of another portion of the interconnector attachment apparatus for the solar cell panel according to the embodiment of the present inventive concept. In addition, FIG. 8 is a conceptual view schematically illustrating a working table, a heat-source unit, and an upper fixing member supply unit of the interconnector attachment apparatus for the solar cell panel according to the embodiment of the present inventive concept. For simplified illustration, in FIG. 7, the upper fixing member supply unit and a solar cell supply unit are omitted.

Referring to FIGS. 6 to 8, the interconnector attachment apparatus for the solar cell panel according to the present embodiment (hereinafter referred to as "interconnector attachment apparatus"), designated by reference numeral 200, may include an interconnector supply unit 210 for unwinding the interconnector 142 from a winding roll 212 and supplying the interconnector 142 in the processing direction, a flux unit 220 for applying flux to the supplied interconnector 142, a drying unit 230 for drying the flux, an interconnector fixing unit 240 for fixing the interconnector 142 to a jig 243, and an attachment unit 250 for attaching the interconnector 142 to the solar cell 150. This will be described below in more detail.

The winding roll 212 may take the form of a cylinder. The interconnector 142 is wound in the circumferential direction of the cylinder. The interconnector 142, wound around the winding roll 212, is unwound from the winding roll 212 and is supplied in the processing direction. In the present embodiment, a plurality of winding rolls 212, which is the same in number as the number of interconnectors 142 to be disposed on one surface of the solar cell 150, may be provided. The winding rolls 212 may be arranged at a constant interval in the horizontal direction and/or the vertical direction, and the interconnectors 142 unwound from the winding rolls 212 may be aligned and moved by a guide 214 such that they are spaced apart from one another by the distance (pitch) at which they are to be arranged on the same surface of the solar cell 150. The guide 214 may have any of various structures for moving the interconnectors 142, which are arranged parallel to each other. In the present embodiment, in one example, the guide 214 may have a plurality of recesses (or concave portions) 214a, which are spaced apart from one another by a constant distance so as to correspond to the respective interconnectors 142, and the respective interconnectors 142 may be moved in the processing direction (e.g. the x-axis in the drawings) in the state in which positions thereof (e.g. positions on the y-axis and the z-axis in the drawings) are fixed by the recesses 214a. For simplified illustration, although only one guide 214 is illustrated in FIG. 6, a plurality of guides 214 may be provided in the processing direction. The structure, shape and the like of the guide(s) 214 may be altered in various ways.

When the interconnectors 142 are moved while being arranged parallel to each other as described above, the multiple interconnectors 142 to be attached to one surface of each solar cell 150 may be subjected to a desired process at the same time, and may be attached to the solar cell 150 at the same time, which may simplify the process. However, the present inventive concept is not limited thereto, and various other alterations or modifications are possible or usable.

The interconnectors 142, unwound from the winding rolls 212 and aligned in a predetermined form, passes through the flux unit 220. The flux unit 220 applies flux to outer surfaces of the interconnectors 142. At this time, the flux may be applied to the outer surfaces of the interconnectors 142 via any of various methods, such as, for example, dipping, spraying, or coating.

The flux, applied to the interconnectors 142 that have passed through the flux unit 220, is hardened while passing through the drying unit 230, thereby forming a flux layer around the outer circumferential surface of each interconnector 142. The drying unit 230 may have any of various structures for drying the flux. In one example, the drying unit 230 may dry the flux using wind, heat or the like. The present inventive concept is not limited as to the structure, method and the like of the drying unit 230.

For simplified and clear illustration, the detailed structures of the flux unit 220 and the drying unit 230 are not illustrated, and various structures may be applied thereto. The flux unit 220 and the drying unit 230 may be located within a single body. However, the present inventive concept is not limited thereto. The arrangement and the like of the flux unit 220 and the drying unit 230 may be altered in various ways.

The interconnectors 142 that have passed through the drying unit 230 are fixed to the jig 243 in the interconnector fixing unit 240.

The jig 243 is provided in the interconnector fixing unit 240, and includes first and second fixing parts 241 and 242, which fix the interconnectors 142 respectively on one side and the other side of the interconnectors 142. At this time, the interconnectors 142 are cut by a cutter 244 so that they have a length suitable for interconnecting two neighboring solar cells 150 or interconnecting the solar cell 150 and the bus ribbon (see reference numeral 145 in FIG. 1) when they are fixed to the jig 243.

In the present embodiment, the jig 243 may include the first fixing part 241, which is formed, on one side of the interconnectors 142, in the direction crossing the direction in which the interconnectors 142 extend so as to fix the interconnectors 142, and the second fixing part 242, which is formed, on the other side of the interconnectors 142, in the direction crossing the direction in which the interconnectors 142 extend so as to fix the interconnectors 142. In one example, each of the first fixing part 241 and the second fixing part 242 may have a linear shape and may extend a long length. In the jig 243 connected to the interconnectors 142, the first fixing part 241 and the second fixing part 242 are spaced apart from each other by a constant distance so as to continuously pull the interconnectors 142 interposed therebetween. Because the interconnectors 142 are configured as, for example, wires having a small width, when the first fixing part 241 and the second fixing part 242 continuously pull the interconnectors 142 as described above, the interconnectors 142 are plastically deformed and thus is no longer deformed. In the present embodiment, because the jig 243 includes the first and second fixing parts 241 and 242 for fixing both ends of the interconnectors 142, the interconnectors 142 may have a simplifies structure that maintains a predetermined yield strength. However, the present inventive concept is not limited thereto, and the structure of the jig 243 may be altered in various ways.

In one example, the first fixing part 241, which is located on one side of the jig 243 (e.g. the entrance side), is movable along three axes (the x-axis, the y-axis, and the z-axis of FIG. 6), which cross one another by an angle at least as large as a right angle, and the second fixing part 242, which is located on the other side of the jig 243 (e.g. the exit side), is movable along three axes (the x-axis, the y-axis, and the z-axis of FIG. 6), which cross one another by an angle at least as large as a right angle. The first and second fixing parts 241 and 242 may be moved to desired positions using various known structures or methods. In addition, the cutter 244 may be located on one side of the jig 243 (e.g. the entrance side) before the first fixing part 241.

The cutter 244 may adopt any of various structures and any of various methods for allowing free movement of the interconnectors 142, or for fixing the interconnectors 142 at predetermined positions or cutting the interconnectors 142 at the fixed positions. The structure of the cutter 244 will be described below in more detail with reference to FIG. 9.

FIG. 9 is a view illustrating an operation of the cutter 244 included in the interconnector attachment apparatus 200 of FIG. 6.

Referring to FIG. 9, in the present embodiment, the cutter 244 may include a first part 2441 and a second part 2442, and the second part 2442 may move relative to the first part 2441 in the left-to-right direction (e.g. the y-axis in the drawings), which is perpendicular to the processing direction of the interconnectors 142. The first part 2441 may include a plurality of first recesses (or first concave portions) R1, through which the respective interconnectors 142 may pass, and the second part 2442 may include a plurality of second recesses (or second concave portions) R2, through which the respective interconnectors 142 may pass. Both side surfaces of the first recess R1 of the first part 2441 may be configured as flat surfaces 2442a that are not sharp, so as to fix the interconnector 142 thereto without damage thereto. In addition, one side surface of the second recess R2 of the second part 2442 may be configured as the flat surface 2442a that is not sharp, so as to fix the interconnector 142 thereto without damage thereto, and the other side surface may be provided with a sharp cutting blade 2442b for cutting the interconnector 142. The cutting blade 2442b may protrude further than one surface of the second part 2442 in the processing direction so as to cut the interconnector 142 at the protruding position. Thereby, the interconnector 142, cut by the cutter 244, may be fixed in the cutter 244 at the position at which the interconnector 142 protrudes further than the surface of the second part 2442 of the cutter 244.

As described above, because the second part 2442 may move relative to the first part 2441 in the left-to-right direction, the width that the first recess R1 and the second recess R2 overlap each other may be freely adjusted. As illustrated in (a) of FIG. 9, when the width that the first recess R1 and the second recess R2 overlap each other is greater than the width of the interconnector 142, the interconnector 142 may freely move. As illustrated in (b) of FIG. 9, when the width that the first recess R1 and the second recess R2 overlap each other is equal to the width of the interconnector 142, the interconnector 142 may be fixed by the first part 2441 and the second part 2442. In addition, as illustrated in (c) of FIG. 9, when the cutting blade 2442b moves across the interconnector 142 and subsequently moves so that the width that the first recess R1 and the second recess R2 overlap each other becomes equal to the width of the interconnector 142, the interconnector 142 may be cut by the cutting blade 2442b and the remaining interconnector 142 may remain fixed in the cutter 244.

The structure and method of the cutter 244 as illustrated in the drawings and described above show that the cutter 244 is formed so as to guide and fix the interconnectors 142 to and at predetermined positions and to perform cutting thereon. However, the present inventive concept is not limited thereto, and the cutter 244 may adopt any of various structures and any of methods for cutting the interconnector 142 to a predetermined length before or after the interconnector 142 is fixed to the jig 243.

In addition, the first fixing part 241 may adopt any of various structures and any of various methods for fixing the interconnectors 142 at predetermined positions or moving the interconnectors 142. For example, the first fixing part 241 may clamp the interconnectors 142 so that the interconnectors 142 are fitted into and fixed to the first fixing part 241.

In one example, in the present embodiment, the first fixing part 241 may include a first part 2411 and a second part 2412, and the second part 2412 may move relative to the first part 2411 in the left-to-right direction (e.g. the y-axis in the drawings), which is perpendicular to the processing direction of the interconnectors 142. The first part 2411 includes a first clamp PA, which corresponds to each interconnector 142 and is located on and comes into contact with one side of the interconnector 142 so as to extend toward the second part 2412 in the longitudinal direction of the interconnector 142, and the second part 2412 includes a second clamp PB, which corresponds to each interconnector 142 and is located on and comes into contact with the other side of the interconnector 142 so as to extend toward the first part 2411 in the longitudinal direction of the interconnector 142. As such, the interconnector 142 may be clamped and stably fixed in the longitudinal direction between the first clamp PA and the second clamp PB.

In one example, as illustrated, the first part 2411 may include a first protruding portion P11, which protrudes downward from the other side of the interconnector 142, a second portion P12, which protrudes from the first protruding portion P11 in the longitudinal direction of the first part 2411 so as to extend to one side of the interconnector 142, and a third protruding portion P13, which protrudes downward from the second portion P12. At this time, the first clamp PA may be located on the third protruding portion P13. Similarly, the second part 2412 may include a first protruding portion P21, which protrudes downward from one side of the interconnector 142, a second portion P22, which protrudes from the first protruding portion P21 in the longitudinal direction of the second part 2412 so as to extend to the other side of the interconnector 142, and a third protruding portion P23, which protrudes downward from the second portion P22. At this time, the second clamp PB may be located on the third protruding portion P23. With this structure, the interconnector 142 may be stably clamped.

In the state in which the interconnector 142 is located between the first clamp PA and the second clamp PB, when the second part 2412 moves relative to the first part 2411 so that the distance between the first clamp PA and the second clamp PB is reduced until the first clamp PA and the second clamp PB come into close contact with respective opposite sides of the interconnector 142, the interconnector 142 may be stably fixed between the first clamp PA and the second clamp PB. Contrary, when the second part 2412 moves relative to the first part 2411 so that the distance between the first clamp PA and the second clamp PB is increased until the distance between the first clamp PA and the second clamp PB becomes greater than the width of the interconnector 142, the interconnector 142 may be stably separated or released from the first clamp PA and the second clamp PB.

Similarly, the second fixing part 242 may include a first part 2421, which includes a first clamp PA and a first fixing piece P1 (i.e. the first to third protruding portions P11, P12 and P13), and a second part 2422, which includes a second clamp PB and a second fixing piece P2 (i.e. the first to third protruding portions P21, P22 and P23). The description related to the first fixing part 241 may be directly applied to the second fixing part 242, and thus a detailed description thereof will be omitted.

Although the first and second parts 2411 and 2412 and 2421 and 2422, provided with the clamps PA and PB, move relative to each other so as to clamp the interconnector 142 in the present embodiment, the present inventive concept is not limited thereto. That is, various other structures may be applied to the structure of the clamps PA and PB, the structure of the first and second fixing pieces P1 and P2, and the structure of the first and second fixing parts 241 and 242.

In addition, the fixing unit 240 may further include a fixing member 246, located before the cutter 244, for fixing the interconnectors 142 during cutting. In one example, the present embodiment illustrates that the fixing member 246 has elements corresponding to the interconnectors 142 in a one-to-one ratio and is configured to push and fix the interconnector 142 when the interconnectors 142 are fixed without movement. A plurality of fixing members 246 may be spaced apart from one another at a constant distance. As such, when the interconnectors 142 are moved, cut, or fixed to the jig 243, the interconnectors 142 may be stably moved or fixed via control of the driving of the fixing members 246. Although the drawings illustrate that two fixing members 246 are provided so that a minimum number of fixing members 246 stably perform the movement or fixing of the interconnector 142, the present inventive concept is not limited thereto. Various other structures may be applied to the structure of the fixing members 246, and the present inventive concept is not limited as to the number of fixing members 246.

The jig 243, to which the interconnectors 142 have been fixed, (i.e. the jig-interconnector coupling), moves to the attachment unit 250. In one example, the first and second fixing parts 241 and 242 may be driven in various directions (e.g. in the x-axis, the y-axis and the z-axis of the drawings) while maintaining a constant distance therebetween. Accordingly, the interconnectors 142 move to the attachment unit 250 while remaining fixed to the jig 243 so as not to be unintentionally deformed.

Various known structures may be applied as the structure for moving the first and second fixing parts 241 and 242 to a desired position. In addition, various structures may be applied as the structure for fixing the interconnectors 142 by the first and second fixing parts 241 and 242.

Referring to FIG. 7, the attachment unit 250 attaches the interconnectors 142 to the solar cell 150 by applying heat thereto via a heat source 258 in the state in which pressure is applied to fix the interconnectors 142 and the solar cell 150 to each other. At this time, in the present embodiment, the jig 243 is separated from the interconnectors 142 after fixing the interconnectors 142 and the solar cell 150 to each other, and the interconnectors 142 and the solar cell 150 pass through the heat source 258 in the absence of the jig 243.

In the present embodiment, the jig 243 is removed in the state in which the interconnectors 142 and the solar cell 150 are pressed together using exhaust adsorption. That is, in the state in which the interconnectors 142 and the solar cell 150 are adsorbed and fixed to each other via exhaust without the jig 243, the interconnectors 142 and the solar cell 150 pass through the heat source 258. Thereby, the interconnectors 142 and the solar cell 150 may be stably fixed to each other via a simple method. In addition, because the jig 243 may be returned to the interconnector fixing unit 240 after transferring the interconnectors 142 to the attachment unit 250, the number of jigs 243 to be operated in the interconnector attachment apparatus 200 may be very small. Productivity may be considerably increased when the number of jigs 243 to be operated is reduced.

An exhaust device (or a vacuum device) 259 for discharging air for exhaust adsorption may be provided. A pump, a compressor or the like may be used as the exhaust device 259, but devices that adopt various other structures, methods, and shapes may be used. Although the exhaust device 259 may be conceptually illustrated below the right side of the attachment unit 250 of FIG. 7 in order to assist understanding, the exhaust device 259 may be located outside the attachment unit 250 so as to be connected to the attachment unit 250 in practice.

At this time, a working table may be configured as a conveyor belt 252 so as to ensure easy exhaust adsorption and easy movement of the interconnectors 142 and the solar cell 150 to the heat source 258. In the present embodiment, a plurality of conveyor belts 252 may be spaced apart from one another. Thereby, the interconnectors 142 and the solar cell 150 may be more easily pressed together because the discharge of air is possible between the conveyor belts 252. In addition, the conveyor belts 252 may have a small width, and thus may be easily driven.

Each conveyor belt 252 may have an exhaust hole 252a therein. Thereby, the solar cell 150 and the interconnectors 142 may be effectively pressed together when the exhaust device 259 performs the discharge of air through the exhaust hole 252a. The exhaust device 259 may have a structure for discharging air through the exhaust hole 252a.

In one example, opposite edge portions of each conveyor belt 252 may be provided with the respective interconnector 142, and a center portion of the conveyor belt 252 may be provided with a plurality of exhaust holes 252a, which are spaced apart from one another by a constant distance in the longitudinal direction of the conveyor belt 252. As such, the interconnectors 142 and the solar cell 150 may be effectively pressed together via the discharge of air between the two adjacent conveyor belts 252 as well as the discharge of air through the exhaust holes 252a in the respective conveyor belts 252. Thereby, the fixing stability of the interconnectors 142 and the solar cell 150 may be improved.

At this time, a third fixing part 254 may be located on one side of the conveyor belts 252 (before the beginning portion of the conveyor belts 252) to prevent deviation in the positions of the interconnectors 142 and the solar cell 150 when the interconnectors 142 and the solar cell 150 are fixed using exhaust adsorption. The third fixing part 254 remains fixed at a constant position relative to the conveyor belts 252.

The third fixing part 254 may adopt any of various structures and any of various methods for fixing the interconnectors 142 at constant positions or moving the interconnectors 142. In one example, in the present embodiment, the third fixing part 254 may include a first part 2541 and a second part 2542, and the second part 2542 may move relative to the first part 2541 in the left-to-right direction (e.g. in the y-axis in the drawings), which is perpendicular to the direction in which the interconnectors 142 extend.

The first part 2541 includes a first clamp PA, which is formed in the longitudinal direction of the interconnector 142 so as to come into close contact with one side of the interconnector 142, and a second clamp PB, which is formed in the longitudinal direction of the interconnector 142 so as to come into close contact with the other side of the interconnector 142. In addition, the first part 2541 may include a first fixing piece P1, which includes a first protruding portion P11 protruding upward from the other side of the interconnector 142, a second portion P12 extending from the first protruding portion P11 to one side of the interconnector 142 in the longitudinal direction of the first part 2541, and a third protruding portion P13 protruding upward from the second portion P12. At this time, the first clamp PA may be located on the third protruding portion P13. Similarly, the second part 2542 may include a second fixing piece P2, which includes a first protruding portion P21 protruding upward from one side of the interconnector 142, a second portion P22 extending from the first protruding portion P21 to the other side of the interconnector 142 in the longitudinal direction of the second part 2542, and a third protruding portion P23 protruding upward from the second portion P22. At this time, the second clamp PB may be located on the third protruding portion P23. With this structure, the interconnector 142 may be stably clamped.

The interconnector 142 may be stably fixed without interfering with the first fixing part 241 because the first clamp PA, the first fixing piece P1, the second clamp PB and the second fixing piece P2 of the third fixing part 254 protrude upward, unlike the first and second fixing parts 241 and 242. With the exception that the first clamp PA, the first fixing piece P1, the second clamp PB and the second fixing piece P2 protrude upward, rather than downward, the first clamp PA, the first fixing piece P1, the second clamp PB and the second fixing piece P2 are the same as those of the first or second fixing part 241 or 242, and thus, the above description related to those of the first or second fixing part 241 or 242 may be directly applied thereto.

Although the present embodiment illustrates that the first and second parts 2541 and 2542 having the clamps PA and PB move relative to each other so as to clamp the interconnector 142, the present inventive concept is not limited thereto. That is, various other structures may be applied as the structure of the clamps PA and PB, the structure of the first and second fixing pieces P1 and P2, and the structure of the first and second fixing parts 241 and 242.

A solar cell supply unit (see reference numeral 251 in FIG. 11) for supplying the solar cell 150 may be provided above the conveyor belts 252. The solar cell supply unit 251 may not be connected to the working table 252, to the heat source 258, or to an upper fixing member supply unit 2560, may be driven by an individual drive unit, and may serve to supply the solar cell 150 to the working table 252. Various known structures and methods may be applied to the solar cell supply unit 251.

The upper fixing member supply unit 2560 may be located above the conveyor belts 252 and may serve to provide an upper fixing member 256, which may fix the interconnectors 142 over the solar cell 150.

Referring to FIG. 8, the upper fixing member 256, supplied from the upper fixing member supply unit 2560, fixes the interconnectors 142 over the solar cell 150, prior to being introduced into the heat source 258. Then, the upper fixing member 256, which fixes the interconnectors 142 over the solar cell 150, passes through the heat source 258 along with the interconnectors 142 and the solar cell 150. The solar cell 150 and the interconnectors 142 are attached to each other while the upper fixing member 256 passes through the heat source 258. After passing through the heat source 258, the upper fixing member 256 may be separated from the solar cell 150 and the interconnectors 142, and may be returned to the upper fixing member supply unit 2560. At this time, the upper fixing member supply unit 2560 may be driven by an individual drive unit without being connected to the working table 252, to the heat source 258 or the like, and may serve to provide the upper fixing member 256 to the upper side of the solar cell 150 and the interconnectors 142.

In one example, the upper fixing member supply unit 2560 may be located so as to extend from a position before the heat source 258 to a position after the heat source 258, thereby easily supplying the upper fixing member 256 to the upper side of the interconnectors 142 and the solar cell 150 and easily collecting the upper fixing member 256 that has passed through the heat source 258 at the position after the heat source 258. However, the present inventive concept is not limited thereto.

The upper fixing member supply unit 2560 may include a plurality of upper fixing members 256. As such, while one upper fixing member 256 is passing through the heat source 258, another upper fixing member 256 may fix the solar cell 150 and the interconnectors 142 located after the heat source 258. In this way, a process of successively attaching the solar cells 150 may be performed.

In the present embodiment, the upper fixing member 256 may include a frame unit 2562; 2566, and a plurality of fixing pieces 2564 fixed to the frame unit 2562; 2566 so as to fix the interconnectors 142. The upper fixing member 256 will be described below in detail with reference to FIG. 10.

Figure 10:
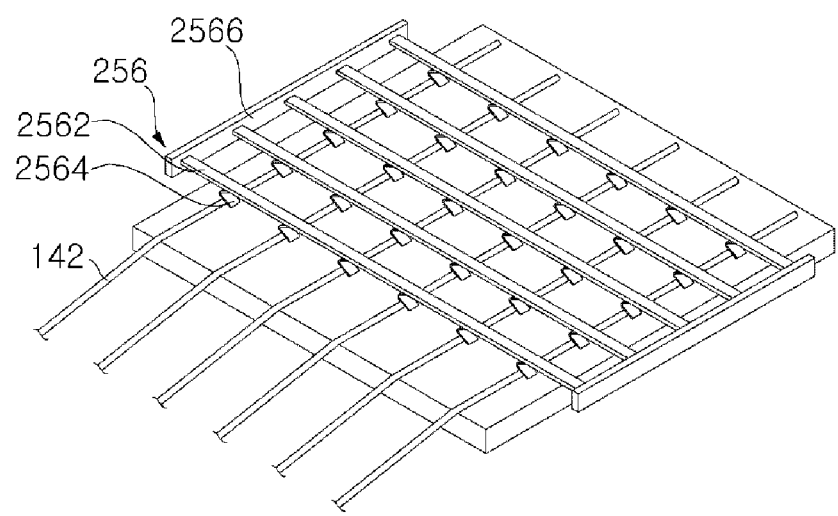
FIG. 10 is a perspective view illustrating the state in which the solar cell and interconnectors disposed thereon are fixed using an upper fixing member included in the interconnector attachment apparatus of FIG. 7.

FIG. 10 is a perspective view illustrating the state in which the solar cell 150 and interconnectors 142 disposed thereon are fixed using the upper fixing member 256 included in the interconnector attachment apparatus 200 of FIG. 7.

Referring to FIGS. 7 and 10, the frame unit 2562 and 2566 may have any of various shapes for fixing the fixing pieces 2564. In one example, the frame unit may include a plurality of first parts 2562 arranged in the direction crossing the direction in which the interconnectors 142 extend, and second parts 2566 for connecting the first parts 2562 to one another at opposite sides thereof. As such, the structure of the upper fixing member 256 may be simplified and the fixing pieces 2564 may be stably fixed.

The fixing pieces 2564 may be located on the first parts 2562 at positions corresponding to the respective interconnectors 142. The fixing pieces 2564 may be located on the respective first parts 2562 so that one interconnector 142 is fixed by the multiple fixing pieces 2464.

Each fixing piece 2564 may have any of various structures for pushing and fixing the interconnector 142. More specifically, the fixing piece 2564 may be formed of an elastic member. In one example, the fixing piece 2564 may have an obliquely bent portion. As such, when the interconnector 142 is located below the bent portion of the fixing piece 2564, the bent portion of the fixing piece 2564 may elastically push the interconnector 142 so as to apply pressure thereto. However, the present inventive concept is not limited thereto, and the structure, method and the like of the upper fixing member 256 may be altered in various ways.

The heat source 258 applies heat to the solar cell 150 at the upper side or the lower side of the conveyor belts 252. The interconnectors 142 may be attached to the electrodes 42 and 44 of the solar cell 150 (more particularly, the pad portions 424) as the solder layers 142b of the interconnectors 142 are melted and soldered by heat supplied from the heat source 258. In the present embodiment, because the heat source 258 directly applies heat, the time of the attachment process may be reduced and the attachment property may be improved. In one example, the heat source 258 may be an infrared lamp. However, the present inventive concept is not limited thereto, and the heat source 258 may adopt any of various structures and any of various methods for supplying heat.

Figure 11:
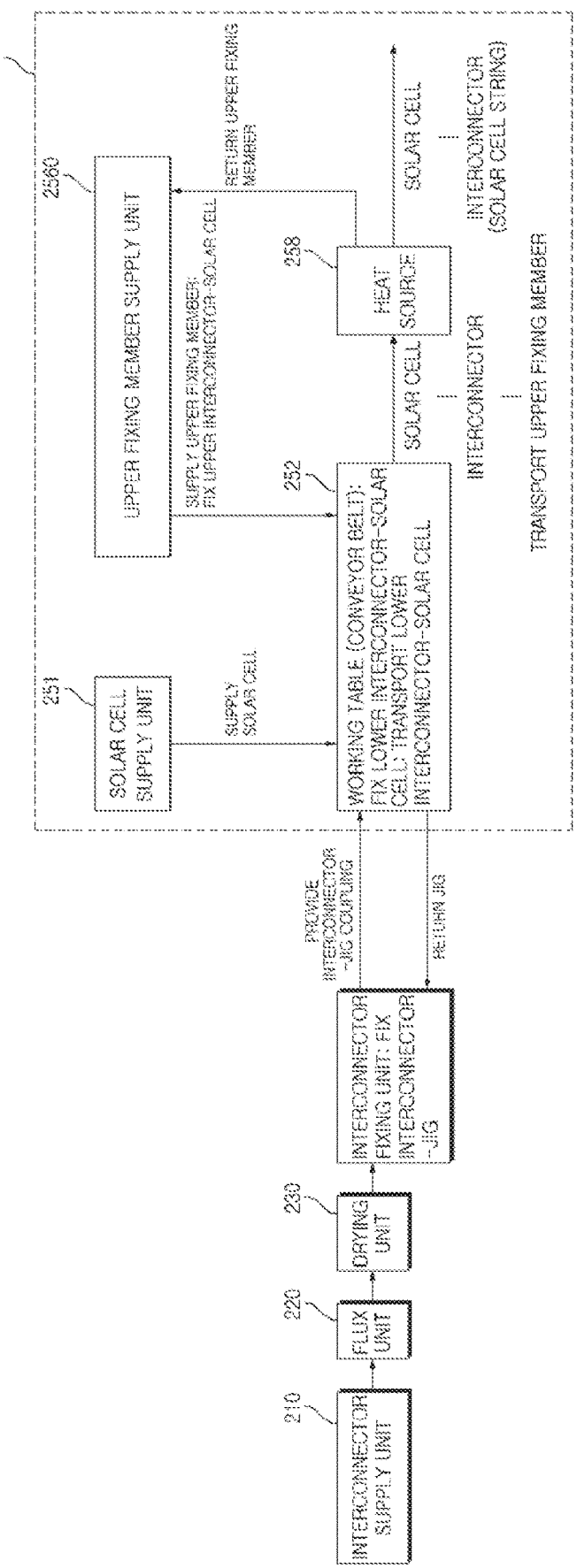
FIG. 11 is a block diagram schematically illustrating the interconnector attachment apparatus according to the embodiment of the present inventive concept.

FIG. 11 is a block diagram schematically illustrating the interconnector attachment apparatus 200 according to the embodiment of the present inventive concept.

Referring to FIG. 11 as well as FIGS. 6 to 8, the interconnectors 142, supplied from the interconnector supply unit 210, are provided to the interconnector fixing unit 240 after passing through the flux unit 220 and the drying unit 230. In the interconnector fixing unit 240, only the interconnectors 142 are fixed to the jig 243 so as to form an interconnector-jig coupling, separately from the solar cell 150.

The formed interconnector-jig coupling is provided to the working table 252. In addition, the solar cell 150 is provided from the solar cell supply unit 251 to the working table 252. At this time, the solar cell 150 and the interconnectors 142 located therebelow are fixed to each other on the working table 252 via adsorption, and the solar cell 150 and the interconnectors 142 located thereabove are fixed to each other by the upper fixing member 256, which is located above them. Once the solar cell 150 and the interconnectors 142 are fixed to each other by the working table 252 or the upper fixing member 256, the jig 243, which has fixed to the interconnectors 142, is separated from the interconnectors 142 and is returned to the interconnector fixing unit 240. As such, the working table 252 serves not only to transport the interconnectors 142 and the solar cell 150, but also to fix the solar cell 150 and the interconnectors 142 located therebelow at predetermined aligned positions to each other.

Then, as the solar cell 150, the interconnectors 142, and the upper fixing member 256 together pass through the heat source 258, the solar cell 150 and the interconnectors 142 are attached to each other so as to form solar cell strings. The upper fixing member 256 that has passed through the heat source 258 is separated from the solar cell 150 and the interconnectors 142 and is returned to the upper fixing member supply unit 2560.

The operation of the interconnector attachment apparatus 200 and the interconnector attachment method according to the present embodiment will be described below in more detail with reference to FIGS. 6 to 11 and FIGS. 12A to 12G.

FIGS. 12A to 12G are views for explaining the operation of the attachment unit 250 included in the interconnector attachment apparatus 200 of FIG. 7.

The multiple interconnectors 142 (more specifically, first interconnectors 1421), which are aligned so as to be spaced apart from one another in the same plane, are provided to the flux unit 220 and the drying unit 230 by the interconnector supply unit 210. Thereby, flux layers are formed on the outer surfaces of the first interconnectors 1421 so as to improve the attachment property of the first interconnectors 1421. For reference, in the present embodiment, the interconnectors 142 that are initially located only below the first solar cell 151 and are attached thereto are referred to as the first interconnectors 1421, and the interconnectors 142 that interconnect the first solar cell 151 and the second solar cell 152 are referred to as second interconnectors 1422. However, the terms "the first interconnectors 1421" and "the second interconnectors 1422" are used only for distinction therebetween, and the present inventive concept is not limited thereto.

The first interconnectors 1421, fixed to the cutter 244 and the fixing member 246, are located so as to protrude further than the flat surface of the second part 2442 of the cutter 244. In this state, the second fixing part 242 moves in the direction opposite the processing direction (e.g. in the negative x-axis direction in the drawings) until it reaches the position at which the first interconnectors 1421 protruding from the cutter 244 are located. At this time, the first fixing part 241 moves upward or downward so that it does not prevent the second fixing part 242 from reaching the first interconnectors 1421, which protrude from the cutter 244. In addition, when the second part 2422 of the second fixing part 242 moves in the left-to-right direction (the y-axis) to adjust the distance between the clamps PA and PB, the first interconnectors 1421 that are fixed to the cutter 244 are fixed to the second fixing part 242.

Subsequently, the fixing member 246 moves to the position at which it does not fix the first interconnectors 1421, and the cutter 244 is released so as not to fix the first interconnectors 1421 as illustrated in (a) of FIG. 9. Thereby, the first interconnector 1421 may be freely movable, rather than being fixed to the cutter 244.

Subsequently, the second fixing part 242 moves in the processing direction (i.e. in the positive x-axis direction in the drawings) by the desired length of the first interconnectors 1421, and the first fixing part 241 moves to the position at which it may fix the first interconnectors 1421 so as to fix one side of the first interconnectors 1421 at the position close to the cutter 244. In addition, the fixing member 246 pushes the first interconnectors 1421 so as to fix the positions of the first interconnectors 1421.

In this state, the cutter 244 operates as illustrated in (c) of FIG. 9 so as to cut the first interconnectors 1421 at the same time. Thereby, all of the first interconnectors 1421, having been cut to the desired length, are fixed to the jig 243 so as to form a first jig-interconnector coupling. At this time, the first interconnectors 1421, fixed between the first fixing part 241 and the second fixing part 242, are plastically deformed upon receiving longitudinal tensile force, and after being plastically deformed, are no longer deformed between the first fixing part 241 and the second fixing part 242, which are maintained at a constant distance. Thereby, the first interconnectors 1421, fixed to the jig 243, are no longer deformed even if the jig 243 moves.

Figure 12A:
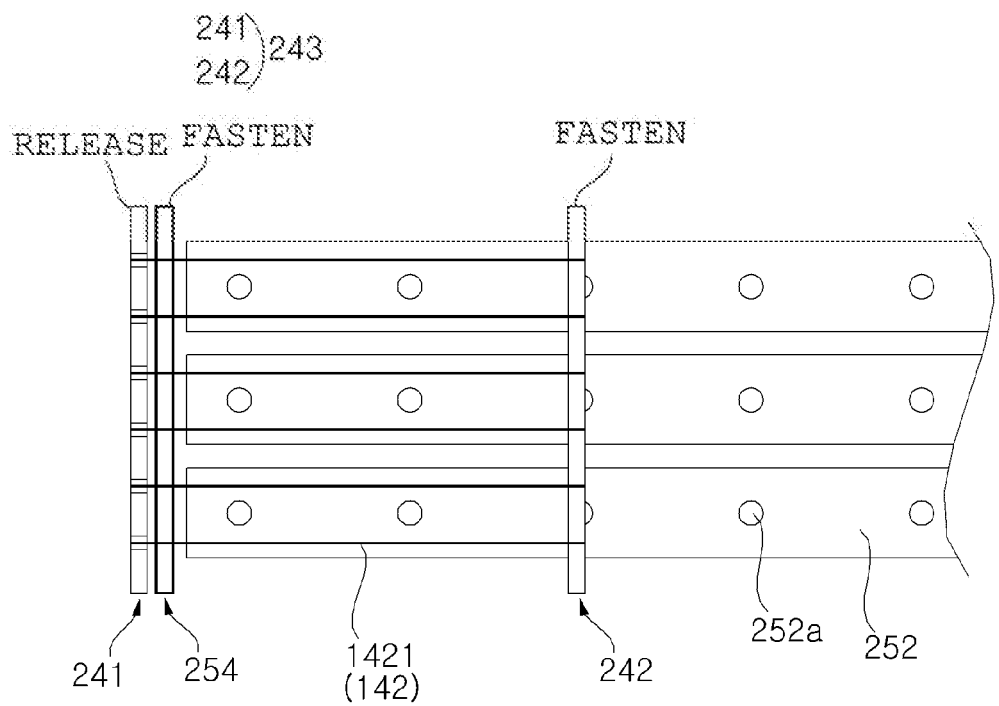
FIGS. 12A to 12G are views for explaining an operation of an attachment unit included in the interconnector attachment apparatus of FIG. 7.
Figure 12B:
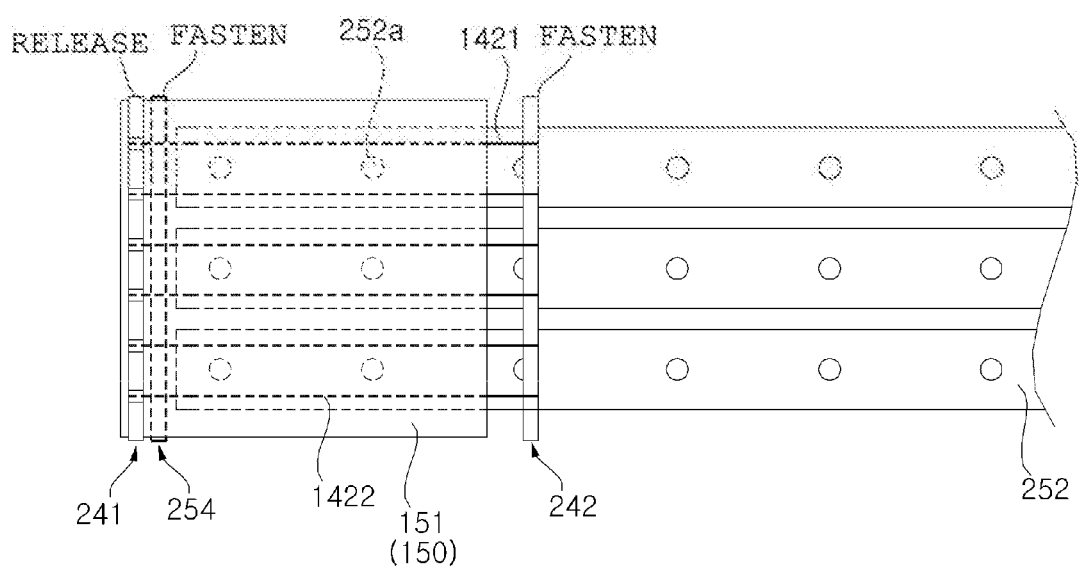

Subsequently, as illustrated in FIGS. 12A and 12B, the jig 243, to which the first interconnectors 1421 are fixed, is placed on the working table, and the first interconnectors 1421 and the first solar cell 151 are fixed to each other.

More specifically, first, as illustrated in FIG. 12A, the jig 243, to which the first interconnectors 1421 are fixed (i.e. the first interconnector-jig coupling), is placed on the conveyor belts 252 that configure the working table. In this state, the third fixing part 254, which is located on one side of the conveyor belts 252, is fastened to the first interconnectors 1421, which have been fixed to the first fixing part 241, between the first fixing part 241 and the second fixing part 242 so as to catch and fix the first interconnectors 1421, and the first fixing part 241 is released from the first interconnectors 1421. At this time, the first interconnectors 1421 may have a first length, which is slightly longer than the first solar cell 151 and is shorter than the sum of the lengths of the first solar cell 151 and the second solar cell 152, so as to allow the first connectors 1421 to be connected to the bus ribbon (see reference numeral 145 in FIG. 1). When the third fixing part 254 fixes one side of the first interconnectors 1421, the first interconnectors 1421 may be stably fixed to the working table because the third fixing part 254 maintains a constant positional relationship with the working table at one side of the working table.

Then, as illustrated in FIG. 12B, an exhaust operation is performed using the exhaust device 259 in the state in which the first solar cell 151 is placed above the conveyor belts 252 and the first interconnectors 1421. Thereby, the first solar cell 151 is pressed toward and fixed to the first interconnectors 1421. At this time, the first fixing part 241 may be located above the first solar cell 151 so that it does not prevent the first solar cell 151 from being adsorbed to the working table 252 above the first interconnectors 1421. As described above, because the first interconnectors 1421 have the first length, which is greater than the length of the first solar cell 151, and the second fixing part 242 is spaced apart from the first solar cell 151 by a predetermined distance, the second fixing part 242, which is fastened to the first interconnectors 1421, does not prevent the first solar cell 151 from being adsorbed and fixed to the working table 252.

Figure 12C:
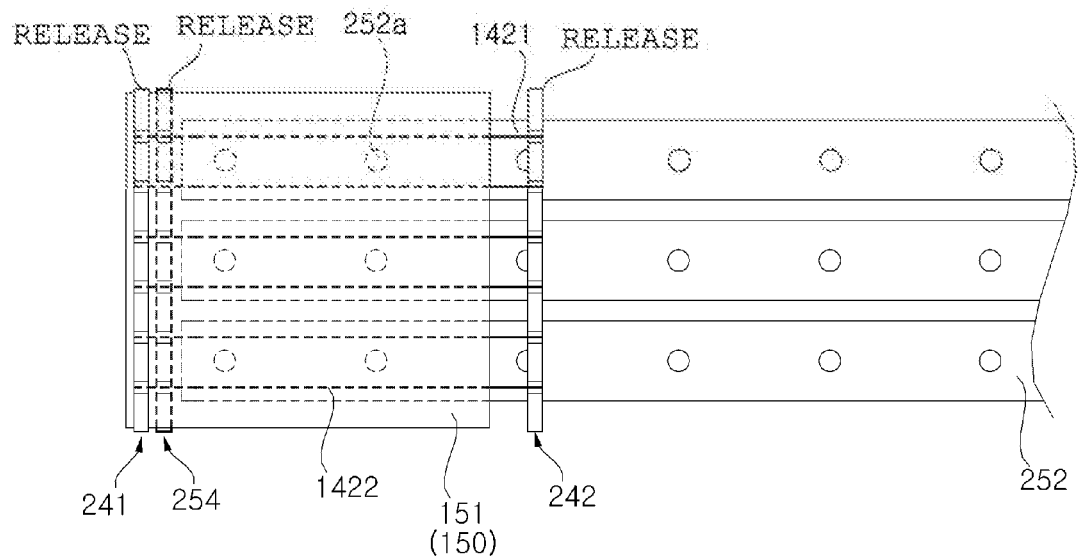

Subsequently, as illustrated in FIG. 12C, the second fixing part 242 is released so that the jig 243 is separated from the first interconnectors 1421. At this time, the third fixing part 243 is released along with the second fixing part 242 so that the first interconnectors 1421 and the first solar cell 151, which are fixed to each other, are movable via movement of the conveyor belts 252. Even if the third fixing part 254 and the second fixing part 242 are released, the conveyor belts 252, the first interconnectors 1421, and the first solar cell 151 are stably fixed to one another via exhaust adsorption. In this way, the jig 243 is completely separated from the first interconnectors 1421, and the separated jig 243 is returned to the interconnector fixing unit 240.

Figure 12D:
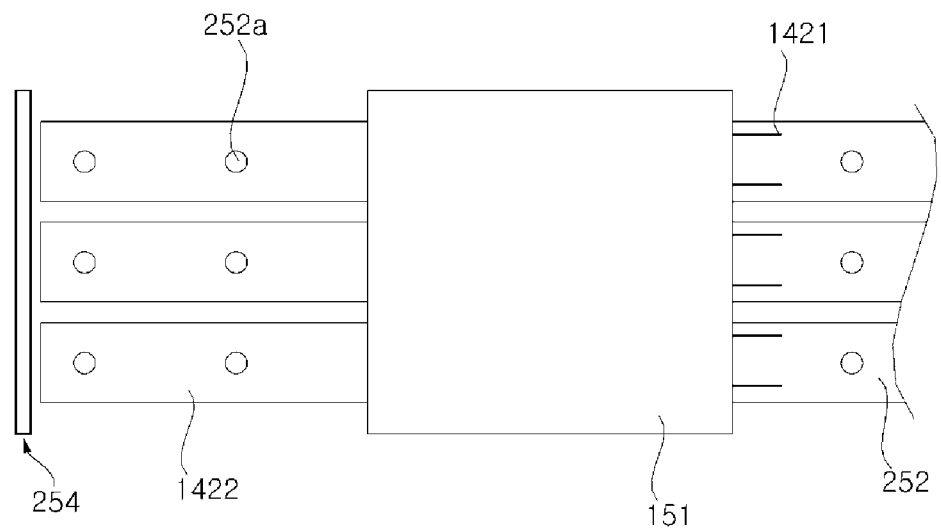

Subsequently, as illustrated in FIG. 12D, the first solar cell 151 and the first interconnectors 142 attached to the lower surface of the first solar cell 151 are moved in the processing direction by the conveyor belts 252.

Figure 12E:
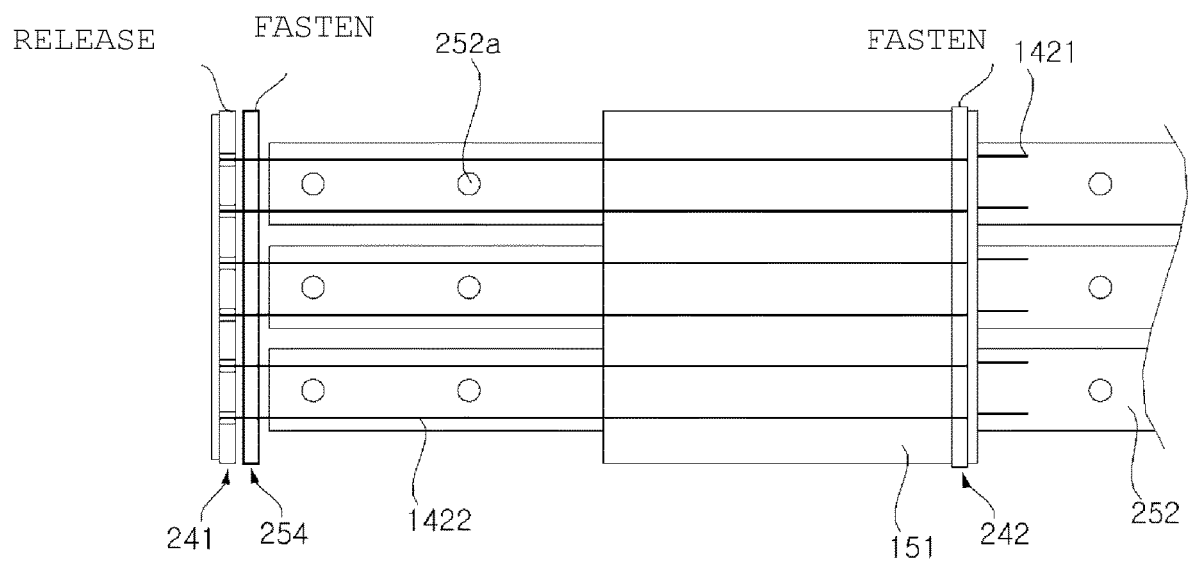
Figure 12F:
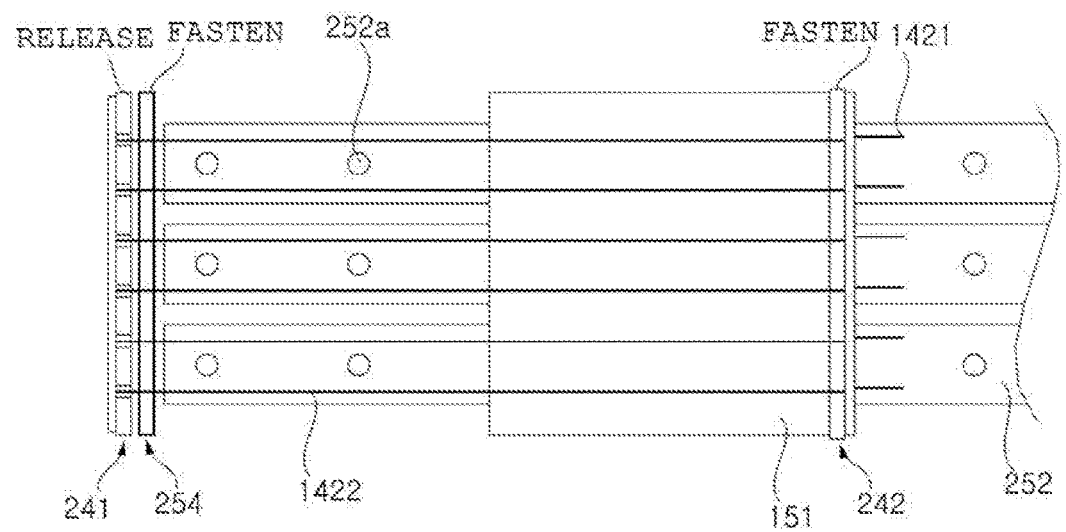

Subsequently, as illustrated in FIGS. 12E and 12F, other interconnectors 142 (i.e. a plurality of second interconnectors 1422) are placed over the first solar cell 151. A portion of each second interconnector 1422 is fixed over the first solar cell 151, and the second solar cell 152 is fixed over another portion of the second interconnector 1422.

That is, as illustrated in FIG. 12E, the jig 243, to which the second interconnectors 1422 are fixed (i.e. a second interconnector-jig coupling), is located so as to move from the third fixing part 254 and pass through the first solar cell 151, which is located over the conveyor belts 252. The second interconnector-jig coupling may be formed via the same method as the method of forming the first interconnector-jig coupling by the interconnector fixing unit 240. The second interconnectors 1422 may have a second length, which is longer than the sum of the lengths of the two solar cells (i.e. the first and second solar cells 151 and 152), so as to interconnect the first and second solar cells 151 and 152.

In this state, the third fixing part 254, which is located on one side of the conveyor belt 252, is fastened to the second interconnectors 1422 so as to catch and fix the second interconnectors 1422, which have been fixed to the first fixing part 241, and the first fixing part 241 is released from the second interconnectors 1422.

Then, as illustrated in FIG. 12F, when the second solar cell 152 is placed over the portions of the second interconnectors 1422 located over the conveyor belts 252, the second interconnectors 1422 are fixed to the second solar cell 152 via exhaust adsorption. In addition, the upper fixing member 256 is located on the second interconnectors 1422 located over the first solar cell 151, so that the fixing pieces 254 push and fix the second interconnectors 1422 as illustrated in FIG. 10.

Figure 12G:
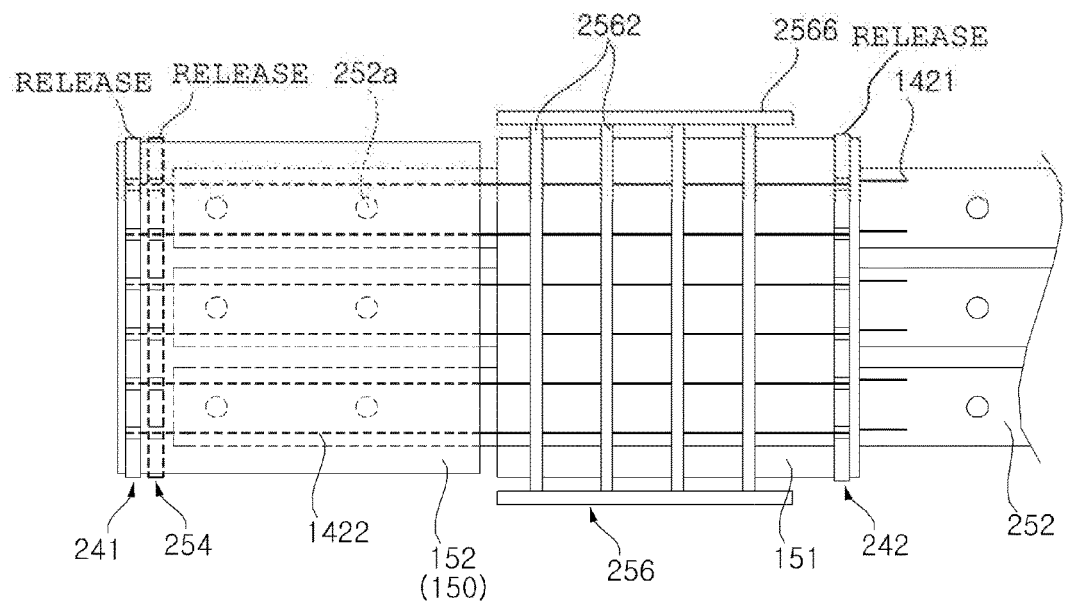

Subsequently, as illustrated in FIG. 12G, the second fixing part 242 is released so that the jig 243 is separated from the second interconnectors 1422. At this time, the third fixing part 254 is released along with the second fixing part 242 so that the second interconnectors 1422 and the second solar cell 152, which are fixed to each other, may move via movement of the conveyor belts 252. Even if the third fixing part 254 and the second fixing part 242 are released, the conveyor belts 252, the second interconnectors 1422 and the first and second solar cells 151 and 152 are stably fixed to one another via exhaust adsorption. In this way, the jig 243 is completely separated from the second interconnectors 1422, and the separated jig 243 is returned to the interconnector fixing unit 240.

When the solar cell 150 passes through the heat source 258 in the state in which all of the interconnectors 142 are attached to the upper surface and the lower surface of the solar cell 150, the flux and the solder layers 142b on the interconnectors 142 are melted, causing the interconnectors 142 to be attached to the first or second electrode 42 or 44 of the solar cell 150. More specifically, the first interconnectors 1421, which are disposed on one surface of the first solar cell 151, and the second interconnectors 1422, which are disposed on the other surface of the first solar cell 151, may be attached to the opposite surfaces of the first solar cell 151 when heat is applied to the first solar cell 151.

In addition, portions of other multiple interconnectors 142 may be placed on a portion of the second solar cell 152, and another solar cell (e.g. a third solar cell) may be placed on other portions of the interconnectors 142. The interconnectors 142 may be attached to the second solar cell 152 by applying heat to the second solar cell 152, on both surfaces of which the interconnectors 142 are placed. A single row of solar cells may be formed by repeating the operation described above. In the state in which the interconnectors 142 having a first length are placed on the last solar cell 150 that constitutes the row of solar cells, heat may be applied to the interconnectors 142, which are fixed using the upper fixing member 256 to attach the interconnectors 142.

According to the present embodiment, the jig 243 is separated from the interconnectors 142 prior to passing through the heat source 258, which may minimize the number of jigs 243 that are operated. Thereby, the structure of the interconnector attachment apparatus 200 may be simplified and productivity may be improved. At this time, when the interconnectors 142 and the solar cell 150 are fixed to each other via exhaust adsorption, the interconnectors 142 and the solar cell 150 may be stably fixed to each other without damage thereto. In addition, the interconnectors 142, cut by the cutter 244, are fixed and attached to the solar cell 150, which may simplify the structure and the process of manufacturing the interconnectors 142. In addition, the attachment of the interconnectors 142 may be automated when the interconnectors 142 pass through the heat source 258 by the conveyor belts 252 while being placed on opposite surfaces of the solar cell 150. Thereby, the interconnectors 142, each of which includes a rounded portion and the solder layer 142b, may be attached to the solar cell 150 using an automated system.

For simplified and clear description, only indispensable components of the interconnector attachment apparatus 200 according to the present embodiment have been described above and illustrated in the drawings. The cutter 244, the fixing member 246, the first fixing part 241, the second fixing part 242, the third fixing part 243, the upper fixing member 256 and the like may be provided with a drive member (e.g. a motor) and a portion connected thereto (e.g. an arm or a link) for driving or changing the position thereof. In addition, a controller for operating the drive member in a wired or wireless manner may be provided. Thereby, the interconnector attachment apparatus 200 may be operated in a desired manner. Various known methods or structures may be applied to the above-described drive member, the connection portion, and the controller.

Figure 13:
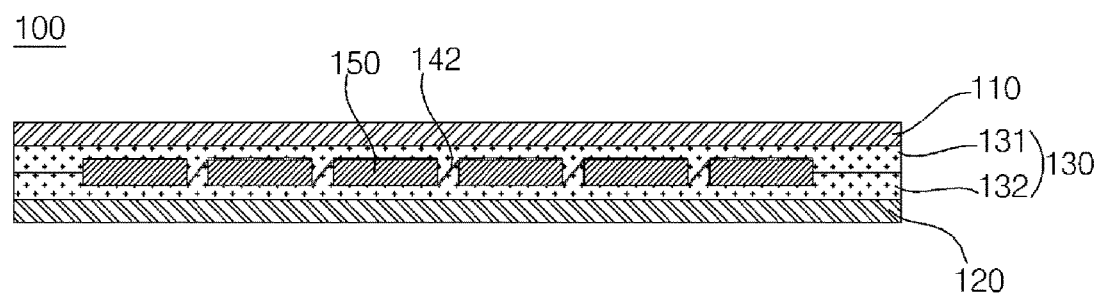
FIG. 13 is a sectional view of a solar cell panel, to which an interconnector attachment apparatus for the solar cell panel according to an embodiment of the present inventive concept may be applied.
Figure 14:
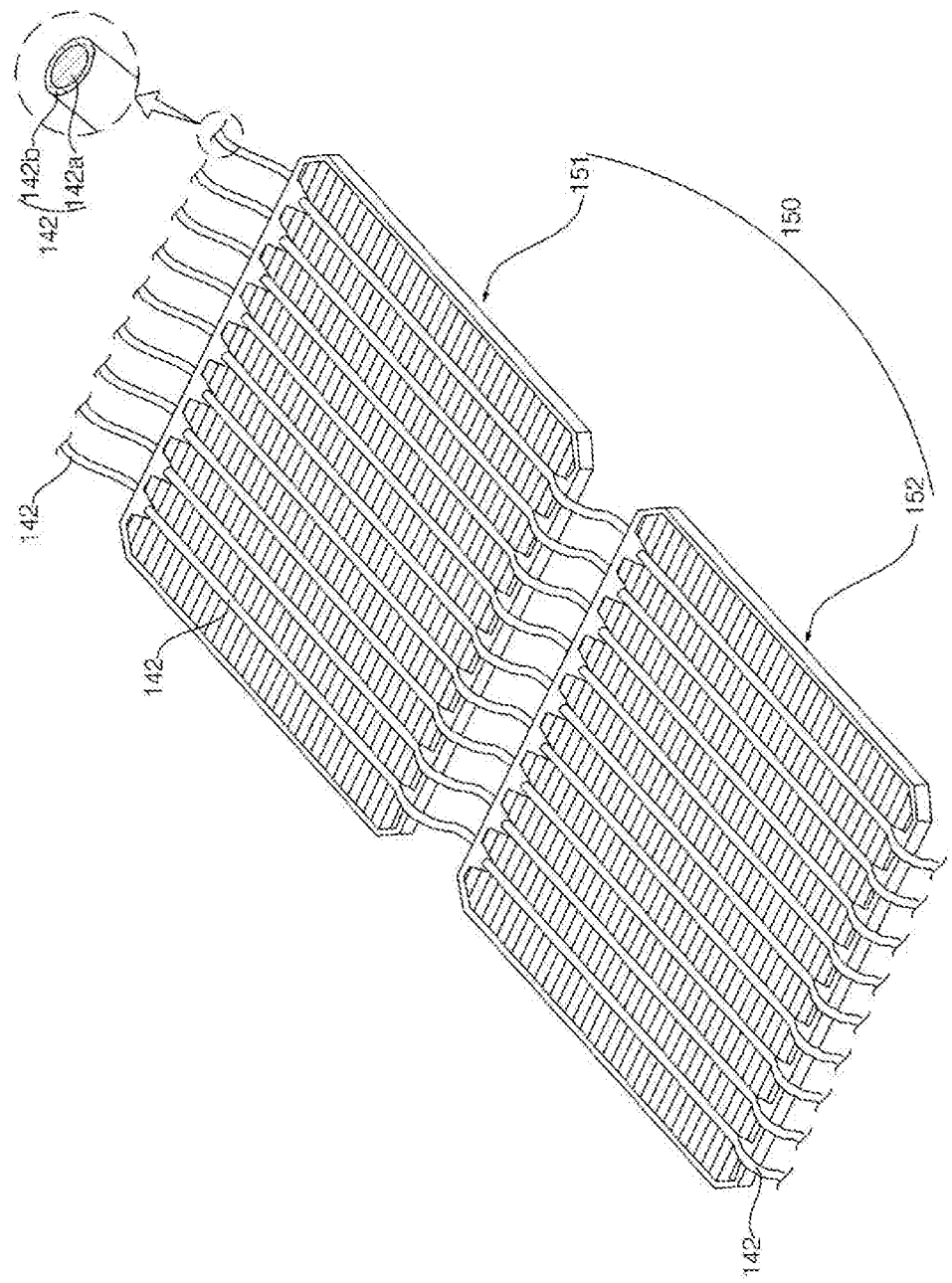
FIG. 14 is a perspective view illustrating the solar cells and the interconnectors of the solar cell panel of FIG. 13.

FIG. 13 is a sectional view of a solar cell panel, to which an interconnector attachment apparatus for the solar cell panel according to an embodiment of the present inventive concept may be applied, and FIG. 14 is a perspective view illustrating the solar cells and the interconnectors of the solar cell panel of FIG. 13.

Referring to FIG. 13, the solar cell panel 100 according to the present embodiment includes the multiple solar cells 150 and the interconnectors 142 for electrically interconnecting the solar cells 150. In addition, the solar cell panel 100 includes the sealing member 130 for surrounding and sealing the solar cells 150 and the interconnectors 142 for interconnecting the solar cells 150, the front substrate 110 disposed on the front surface of the solar cells 150 above the sealing member 130, and the back substrate 120 disposed on the back surface of the solar cells 150 above the sealing member 130. This will be described below in more detail.

In the present embodiment, each solar cell 150 may include a semiconductor substrate, an emitter area formed on the semiconductor substrate or on one surface of the semiconductor substrate, a back-surface field area formed on the other surface of the semiconductor substrate, a first electrode connected to the emitter area, and a second electrode connected to the back-surface field area. In one example, the solar cell 150 may be a silicon semiconductor solar cell based on the semiconductor substrate that includes monocrystalline or polycrystalline silicon. Thereby, the solar cell 150 may have high efficiency. However, the present inventive concept is not limited thereto, and the solar cell 150 may have any of various structures.

The solar cells 150 may be electrically interconnected in series and/or in parallel by the interconnectors 142. Specifically, the interconnectors 142 have a smaller width than the width of the solar cells 150 and extend from the top of the first electrode on the first solar cell 151 to the top of the second electrode on the second solar cell 152 adjacent to the first solar cell 151 so as to electrically interconnect the two neighboring solar cells 151 and 152. When three or more solar cells 150 are provided, the interconnectors 142 are located on two neighboring solar cells as described above so that the solar cells 150 are successively electrically interconnected.

In the present embodiment, the interconnector 142 may be configured as a wire, which has a greater width than the width of a conventional ribbon (e.g. within a range from 1 mm to 2 mm) and extends a long length. In this instance, the interconnector 142 may include the core layer 142a, which is formed of a metal, and the solder layer 142b, which is coated over the surface of the core layer 142a at a small thickness and includes a solder material so as to enable soldering with the electrodes. In one example, the width or diameter of the interconnector 142 may range from 250 μm to 500 μm. In this instance, the width or diameter of the interconnector 142 may mean the width or diameter of the core layer 142a because the shape and the like of the interconnector 142 may vary after soldering and the solder layer 142b has a small thickness. At this time, the wire, which configures the interconnector 142, may include a rounded portion. That is, the wire, which configures the interconnector 142, may have a circular, oval, or curvilinear cross section, or a rounded cross section.

In addition, six to thirty-three interconnectors 142 may be provided on one surface of the solar cell 150. At this time, the number of interconnectors 142 may be ten or more (e.g. twelve or thirteen) in order to further improve the output of the solar cell panel 100. However, the present inventive concept is not limited thereto. At this time, the pitch of the interconnectors 142 may range from 4.75 mm to 26.13 mm. However, the aforementioned numerical values are given by way of example, and the present inventive concept is not limited thereto.

The sealing member 130 may include the first sealing member 131 disposed on the front surface of the solar cells 150 interconnected by the interconnectors 142, and the second sealing member 132 disposed on the back surface of the solar cells 150. In one example, the first sealing member 131 and the second sealing member 132 may be formed of ethylene vinyl acetate (EVA) copolymer resin, polyvinyl butyral, silicone resin, ester-based resin, or olefin-based resin. The front substrate 110 may be formed of a light-transmitting material capable of transmitting light, and the back substrate 120 may be configured as a sheet formed of a light-transmitting material, a material not transmitting light, or a material reflecting light. In one example, the front substrate 110 may be configured as a glass substrate, and the back substrate 120 may be a Tedlar/PET/Tedlar (TPT) substrate, or may include a polyvinylidene fluoride (PVDF) resin layer formed on at least one surface of a base film (e.g. a polyethyleneterephthlate (PET) film). However, the present inventive concept is not limited thereto.

When the wire, which has a small width or diameter as in the present embodiment, is used as the interconnector 142, material costs may be considerably reduced and a sufficient number of interconnector 142 may be provided to minimize the movement distance of carriers, which may enhance the output of the solar cell panel 100. In addition, the interconnectors 142 each having a rounded portion may cause reflection or diffused reflection, which enables the reuse of light.

In the present embodiment, as described above, a great number of interconnectors 142, each of which takes the form of a wire having a small width or diameter and a circular cross-sectional shape, may be attached to the solar cell 150. Thereby, the interconnector attachment apparatus, which may attach the interconnectors 142 to the solar cell 150 so as to have high attachment force despite the wire shape thereof, and may attach all of the interconnectors 142 at the same time so as to improve productivity, may be required. In consideration of this, the interconnector attachment apparatus for the solar cell panel according to the present embodiment will be described below in detail with reference to FIGS. 15 to 21.

Figure 15:
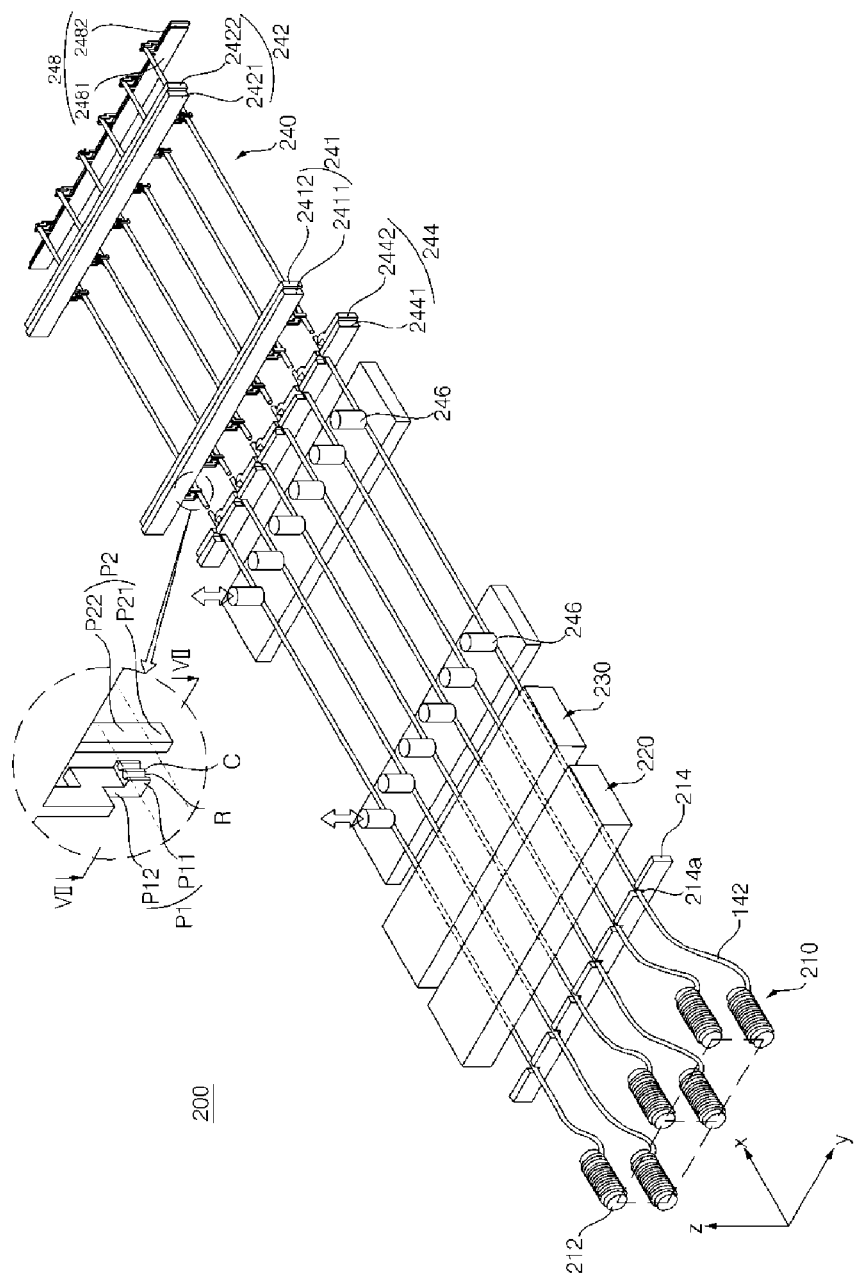
FIG. 15 is a view schematically illustrating the configuration of a portion of the interconnector attachment apparatus for the solar cell panel according to the embodiment of the present inventive concept.
Figure 16:
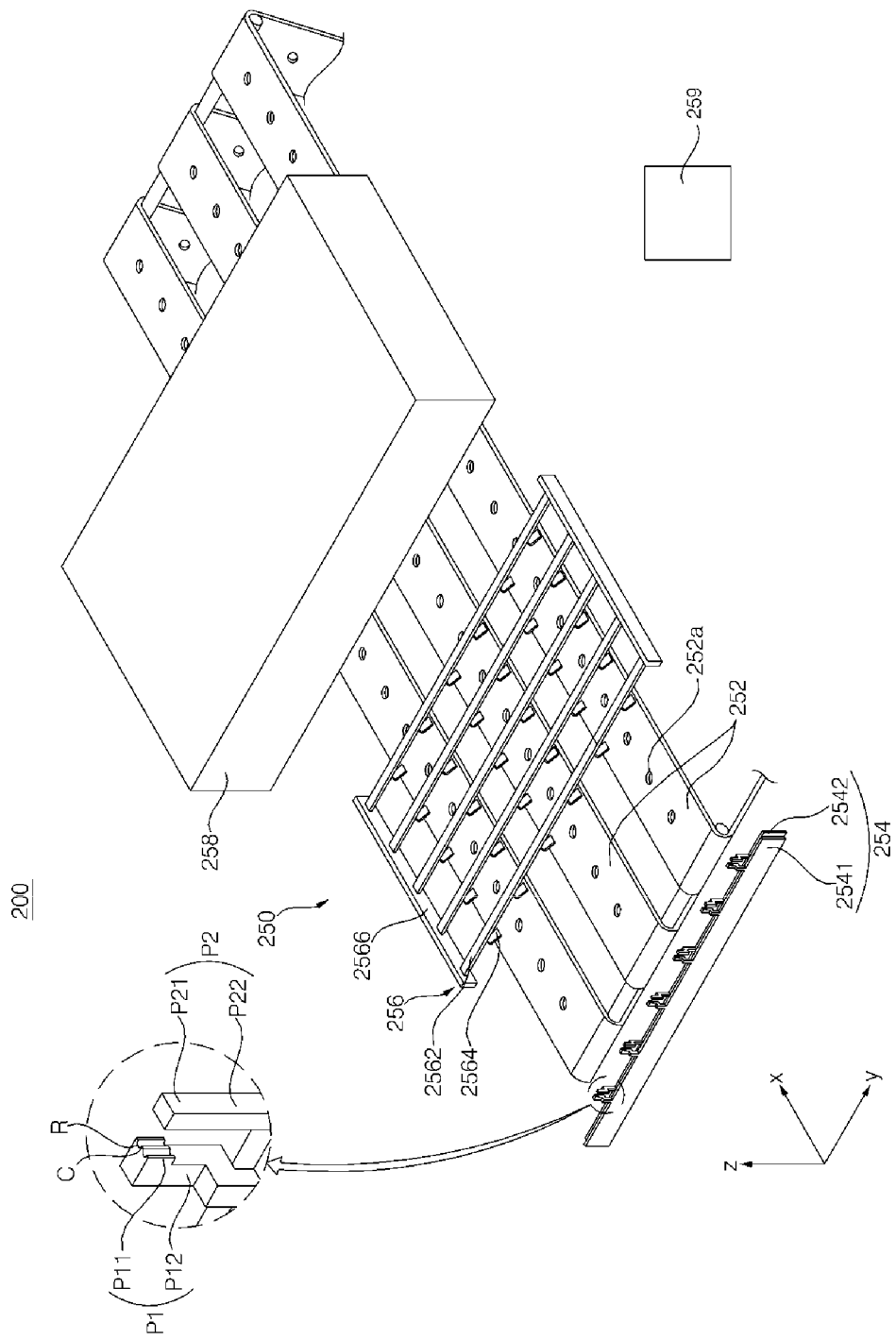
FIG. 16 is a view schematically illustrating the configuration of another portion of the interconnector attachment apparatus for the solar cell panel according to the embodiment of the present inventive concept.
Figure 17:
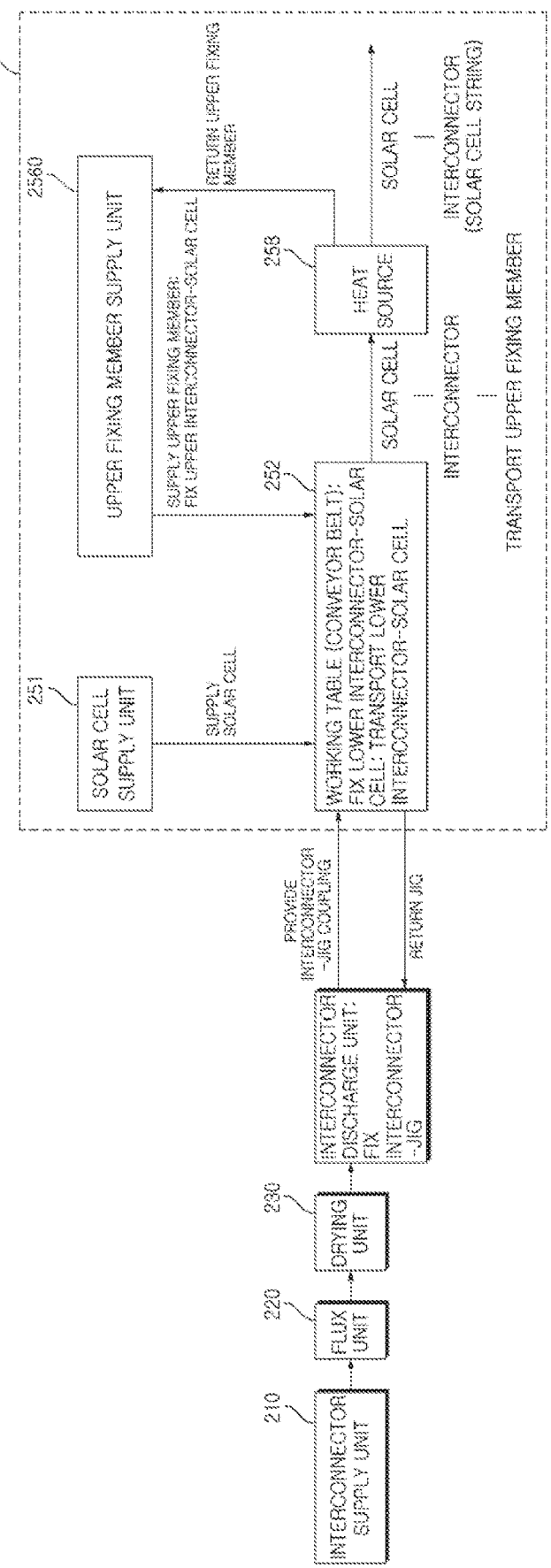
FIG. 17 is a block diagram schematically illustrating the interconnector attachment apparatus according to the embodiment of the present inventive concept.
Figure 18:
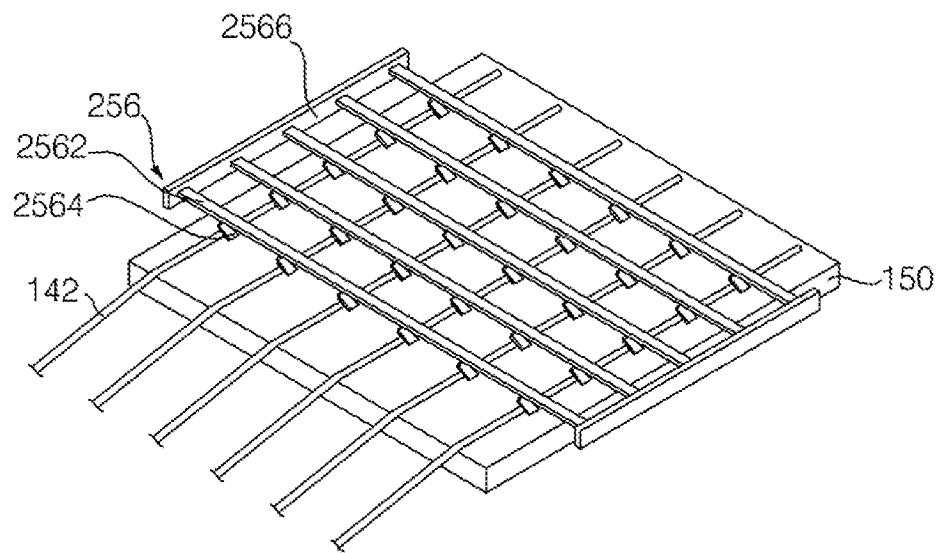
FIG. 18 is a perspective view illustrating the state in which the solar cell and interconnectors disposed thereon are fixed to each other using an upper fixing member included in the interconnector attachment apparatus of FIG. 16.

FIG. 15 is a view schematically illustrating the configuration of a portion of the interconnector attachment apparatus for the solar cell panel according to the embodiment of the present inventive concept. FIG. 16 is a view schematically illustrating the configuration of another portion of the interconnector attachment apparatus for the solar cell panel according to the embodiment of the present inventive concept. FIG. 17 is a block diagram schematically illustrating the interconnector attachment apparatus according to the embodiment of the present inventive concept. FIG. 18 is a perspective view illustrating the state in which the solar cell and interconnectors disposed thereon are fixed to each other using the upper fixing member included in the interconnector attachment apparatus of FIG. 16. For simplified illustration, in FIG. 16, the upper fixing member supply unit 2560 and the solar cell supply unit 251 are illustrated.

Referring to FIGS. 15 to 18, the interconnector attachment apparatus for the solar cell panel 200 according to the present embodiment (hereinafter referred to as "interconnector attachment apparatus") may include the interconnector supply unit 210 for unwinding the interconnector 142 from the winding roll 212 and supplying the interconnector 142 in the processing direction, the flux unit 220 for applying flux to the supplied interconnector 142, the drying unit 230 for drying the flux, an interconnector discharge unit 240 for fixing the interconnector 142 to the jig 243, and the attachment unit 250 for attaching the interconnector 142 to the solar cell 150.

The interconnector 142, supplied from the interconnector supply unit 210, passes through the flux unit 220 and the drying unit 230. Then, the interconnector 142 having a flux layer formed thereon is provided to the interconnector discharge unit 240. After only the interconnector 142 is fixed to the jig 243 in the interconnector discharge unit 240, the cutter 244 cuts the interconnector 142. Thereby, the solar cell 150 and the cut interconnector 142 are separately fixed to the jig 243 so as to form an interconnector jig coupling 243a.

In the present embodiment, the jig 243 includes the first fixing part 241 fixed on one side of the interconnector 142 and the second fixing part 242 fixed on the other side of the interconnector 142. The first fixing part 241 and the second fixing part 242 may be respectively provided with the clamps P1 and P2, which respectively move to change the distance therebetween so as to clamp the interconnector 142. The clamps P1 and P2 of the first and second fixing parts 241 and 242 will be described below in more detail. The cutter 244 may adopt any of various structures and any of various methods for cutting the interconnector 142 after the interconnector 142 is fixed to the jig 243.

The interconnector discharge unit 240 may include an interconnector fixing member 248, which is spaced apart from the cutter 244 by a predetermined distance so as to fix the interconnector 142. The interconnector fixing member 248 may move in the processing direction of the interconnector 142 and the direction opposite the processing direction (the x-axis in the drawing). In the present embodiment, the interconnector fixing member 248 may move in the processing direction while clamping and holding the interconnector 142, and may fix one side of the interconnector 142 while being spaced apart from the cutter 244 by a desired length. At this time, the fixing member 246 pushes the interconnector 142 so as to fix the position of the interconnector 142. In this state, the first and second fixing parts 241 and 242, which constitute the jig 243, fix the interconnector 142 at the upper side thereof, and the cutter 244 cuts the interconnector 142. Then, when the interconnector fixing member 248 releases the interconnector 142, the interconnector 142 is fixed to each of the first and second fixing parts 241 and 242 so as to form the interconnector-jig coupling 243a.

In the present embodiment, the interconnector fixing member 248 may be additionally provided along with the first and second fixing parts 241 and 242, and may share the role of the first and second fixing parts 241 and 242. This may simplify the structure or driving of the interconnector attachment apparatus 200. However, the present inventive concept is not limited thereto, and the second fixing part 242 may perform the role of the interconnector fixing member 248.

The interconnector fixing member 248 may be provided with clamps, which move to change the distance therebetween so as to clamp the interconnector 142. The interconnector fixing member 248 will be described below in more detail.

Various members or devices for aligning or guiding the positions of the interconnectors 142 may be arranged in the movement path in which the interconnector supply unit 210, the flux unit 220, the drying unit 230 and the interconnector discharge unit 240 are arranged. In one example, the guide 214 for guiding the interconnector 142 so as to be located at a desired position and a push member 246 for pushing and fixing the interconnector 142 while the interconnector 142 is not moved may be additionally provided. Although the drawing illustrates that the guide 214 has the recess 214a through which the interconnector 142 passes so as to guide the interconnector 142 by way of example, the present inventive concept is not limited thereto. Accordingly, the shape, structure, method, and the like of the guide 214 and the push member 246 may be altered in various ways.

The interconnector-jig coupling 243a, which is formed in the interconnector discharge unit 240, is transported to the conveyor belt 252. In one example, the interconnector-jig coupling 243a may be transported as a transport member for transporting the jig 243 transports the jig 243 from the interconnector discharge unit 240 to the conveyor belts 252. The transport member may adopt any of various known structures and any of various methods. In addition, the solar cell 150 is provided from the solar cell supply unit 251 to the conveyor belts 252.

At this time, the conveyor belt 252 has the exhaust hole 252a. Thereby, the solar cell 150 and the interconnector 142 located therebelow (i.e. located between the solar cell 150 and the conveyor belt 252) may be effectively compressed when the exhaust device 259 performs exhaust through the exhaust hole 252a. The exhaust device 259 may be configured to discharge air through the exhaust hole 252a. As such, the solar cell 150 and the interconnector 142 located therebelow are fixed on the conveyor belt 252 via adsorption.

At this time, the third fixing part 254 may be located on one side of the conveyor belt 252 (before the beginning portion of the conveyor belt 252) to prevent deviation in the positions of the interconnector 142 and the solar cell 150 when the interconnector 142 and the solar cell 150 are fixed using exhaust adsorption. The third fixing part 254 remains fixed at a constant position relative to the conveyor belt 252. The third fixing part 254 may include the clamps P1 and P2 for fixing the interconnector 142. The structure of the clamps P1 and P2 will be described below in more detail.

In addition, the solar cell 150 and the interconnector 142 located thereabove are fixed by the upper fixing member (or fixing member) 256, which is located thereabove.

The upper fixing member 256, supplied from the upper fixing member supply unit 2560, fixes the interconnector 142 over the solar cell 150, prior to being introduced into the heat source 258. Then, the upper fixing member 256, which fixes the interconnector 142 over the solar cell 150, passes through the heat source 258 along with the interconnector 142 and the solar cell 150. The solar cell 150 and the interconnector 142 are attached to each other while the upper fixing member 256 passes through the heat source 258. After passing through the heat source 258, the upper fixing member 256 may be separated from the solar cell 150 and the interconnector 142 and may be returned to the upper fixing member supply unit 2560. At this time, the upper fixing member supply unit 2560 may be driven by an individual drive unit without being connected to the conveyor belt 252, to the heat source 258 or the like, and may serve to provide the upper fixing member 256 to the upper side of the solar cell 150 and the interconnector 142.

In one example, the upper fixing member supply unit 2560 may be located so as to extend from a position before the heat source 258 to a position after the heat source 258, thereby easily supplying the upper fixing member 256 to the top of the interconnector 142 and the solar cell 150 and easily collecting the upper fixing member 256 that has passed through the heat source 258 at the position after the heat source 258. However, the present inventive concept is not limited thereto.

The upper fixing member supply unit 2560 may include a plurality of upper fixing members 256. As such, while one upper fixing member 256 is passing through the heat source 258, another upper fixing member 256 may fix the solar cell 150 and the interconnector 142 located after the heat source 258. In this way, a process of successively attaching the solar cells 150 may be performed.

In the present embodiment, the upper fixing member 256 may include the frame unit 2562; 2566, and a plurality of press pieces 2564 fixed to the frame unit 2562; 2566 so as to fix the interconnectors 142.

The frame unit 2562; 2566 may have any of various shapes for fixing the press pieces 2564. In one example, the frame unit may include the first parts 2562 arranged in the direction crossing the direction in which the interconnector 142 extends, and the second parts 2566 for connecting the first parts 2562 to one another at opposite sides thereof. As such, the structure of the upper fixing member 256 may be simplified and the press pieces 2564 may be stably fixed. Although the drawing illustrates that the second parts 2566 have a linear shape and are respectively located on opposite sides, the present inventive concept is not limited thereto. The second parts 2566 may have a picture frame shape, or may have a hollow square column shape. The first parts 2562 and the second parts 2566 may be integrally formed with each other, or may be separately formed so as to be fastened to each other using fastening members, for example, screws.

The press pieces 2564 may be integrally formed with the first part 2562, or may be fixed or coupled to the lower surface of the first part 2562. In one example, the press pieces 2564 may be separably coupled to the first part 2562 for easy repair or replacement. Various known structures may be used to fix or couple the press pieces 2564 to the lower surface of the first part 2562.

The multiple first parts 2562 may be spaced apart from one another by a constant distance so as to stably press the solar cell 150. At this time, the first parts 2562 and/or the second parts 2566 may be heavy such that the press pieces 2564 press the interconnector 142 on the solar cell 150. That is, the frame unit 2562; 2566 may apply pressure to the interconnector 142 due to the weight thereof. Thereby, no device for applying pressure needs be provided, which may simplify the overall manufacturing facility.

The press pieces 2564 may be located on positions of the first part 2562 at which the interconnectors 142 are located. In one example, the press pieces 2564 may be spaced apart from one another by the same distance as the distance between the interconnectors 142 fixed on the solar cell 150, and may be provided in the same number as the number of interconnectors 142 so as to be fixed in a row on the first part 2562. Thereby, the press pieces 2564, arranged on each of the first parts 2562, may press and fix one interconnector 142.

The press pieces 2564 may have any of various structures for pushing and fixing the interconnector 142. The press pieces 2564 may have elasticity, and may include an obliquely bent portion or a rounded portion. In one example, the press pieces 2564 may have an approximately C-shaped, U-shaped or V-shaped form.

When the solar cell 150 and the interconnectors 142 are fixed to each other by the conveyor belts 252 and/or the upper fixing member 256, the jig 243 and the third fixing part 254, which have been used to fix the interconnectors 142, are separated from the interconnectors 142, and the jig 243 is returned to the interconnector discharge unit 240. As such, the conveyor belt 252 serves not only to transport the interconnectors 142 and the solar cell 150, but also to fix the solar cell 150 aligned at a predetermined position and the interconnectors 142 located below the solar cell 150 to each other.

The solar cell 150, the interconnectors 142, and the upper fixing member 256 together pass through the heat source 258 so that the solar cell 150 and the interconnectors 142 are attached to each other so as to form solar cell strings. The upper fixing member 256 that has passed through the heat source 258 is separated from the solar cell 150 and the interconnectors 142, and is returned to the upper fixing member supply unit 2560.

At this time, in the state in which the interconnectors 142 and the solar cell 150 are pressed together and fixed to each other, the attachment unit 250 attaches the interconnectors 142 to the solar cell 150 by applying heat (e.g. radiant heat) via the emission of light using the heat source 258.

More specifically, the heat source 258 provides heat by emitting light to the solar cell 150 from the upper side or the lower side of the conveyor belts 252. The solder layer 142b on the interconnector 142 is melted and soldered by heat provided by the heat source 258. Thereby, the interconnector 142 is attached to the electrodes 42 and 44 of the solar cell 150. In the present embodiment, when the heat source 258 applies heat via the emission of light, the time of the attachment process may be reduced and the attachment property may be improved. In one example, the heat source 258 may be an infrared lamp. However, the present inventive concept is not limited thereto, and the heat source 258 may adopt any of various structures and any of various methods for supplying heat.

Hereinafter, the jig 243, the clamps P1 and P2 of the interconnector fixing member 248, or the third fixing part 254 will be described below in detail with reference to FIGS. 19 to 21 as well as FIG. 15. More specifically, the clamps P1 and P2 of the jig 243 will be described in detail, and then the clamps P1 and P2 of the interconnector fixing member 248 or the third fixing part 254 will be described with reference to FIGS. 19 to 21 as well as FIG. 15.

Figure 19:
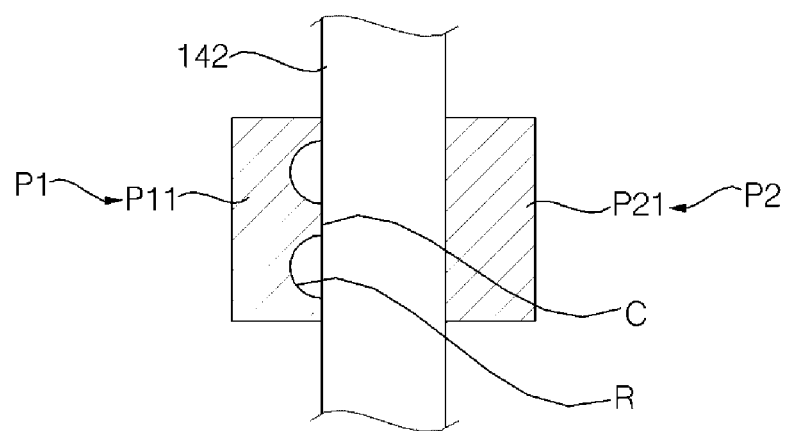
FIG. 19 is a sectional view taken along line VII-VII of FIG. 15.
Figure 20:
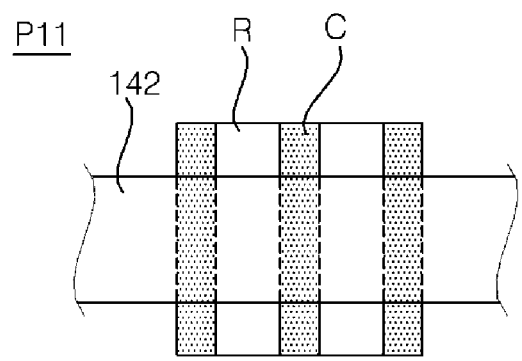
FIG. 20 is a side view illustrating a first contact portion and the interconnector in the interconnector attachment apparatus for the solar cell panel of FIG. 15.

FIG. 19 is a sectional view taken along line VII-VII of FIG. 15, and FIG. 20 is a side view illustrating a first contact portion P11 and the interconnector 142 in the interconnector attachment apparatus 200 for the solar cell panel 100 of FIG. 15.

Referring to FIGS. 15, 19 and 20, the clamps P1 and P2 clamp each interconnector 142 so that the interconnector 142 is fixed at a predetermined position or is movable.

In one example, in the present embodiment, the first fixing part may include the first part 2411 and the second part 2412, and the second part 2412 may move relative to the first part 2411 in the left-to-right direction (e.g. the y-axis in the drawings), which is perpendicular to the processing direction of the interconnectors 142. The first part 2411 includes a first clamp P1, which corresponds to each interconnector 142 and is located on and comes into contact with one side of the interconnector 142. The second part 2412 includes a second clamp P2, which corresponds to each interconnector 142 and is located on and comes into contact with the other side of the interconnector 142. As such, the second clamp P2 corresponds to the first clamp P1 on the other side of the interconnector 142, which is opposite the first clamp P1. As such, the interconnector 142 may be stably fixed between the first clamp P1 and the second clamp P2 when the first clamp P1 and the second clamp P2 apply force to the interconnector 142 located therebetween.

In one example, the first clamp P1 includes a first contact portion P11, which comes into contact with one side of the interconnector 142, and a first connection portion P12, which connects the first part 2411 and the first contact portion P11 to each other. At this time, the first contact portion P11 may protrude from the first connection portion P12 toward the second clamp P2 (or the interconnector 142). That is, the surface of the first contact portion P11, which is close to the second clamp P2, may protrude further toward the second clamp P2 than the surface of the first connection portion P12, which is close to the second clamp P2. Thereby, only the first contact portion P11 may come into contact with the interconnector 142, and force to be applied to the interconnector 142 may be concentrated, which may allow the interconnector 142 to be stably clamped.

The second clamp P2 includes a second contact portion P21, which comes into contact with the other side of the interconnector 142, and a second connection portion P22, which connects the second part 2412 and the second contact portion P12 to each other. The second contact portion P21 may be formed so as to face the first contact portion P11 with the interconnector 142 interposed therebetween. That is, the first contact portion P11 and the second contact portion P21 may be located on opposite sides of a specific portion of the interconnector 142. The drawing illustrates that the second clamp P2 linearly extends downward and that the first connection portion P12 of the first clamp P1 extends in the longitudinal direction of the interconnector 142 so as to be located close to the second clamp P2 or the second part 2412, and subsequently is bent so as to extend downward. However, the present inventive concept is not limited thereto, and the first contact portion P11 and the second contact portion P21 may adopt any of various structures, methods, or shapes for facing each other.

In the state in which the interconnector 142 is located between the first clamp P1 and the second clamp P2, the first part 2411 and/or the second part 2412 may move to reduce the distance between the first clamp P1 and the second clamp P2 until the first clamp P1 and the second clamp P2 come into close contact with opposite sides of the interconnector 142. Thereby, the interconnector 142 may be stably fixed between the first clamp P1 and the second clamp P2. Contrary, when the first part 2411 and/or the second part 2412 move to increase the distance between the first clamp P1 and the second clamp P2 so that the distance between the first clamp P1 and the second clamp P2 becomes greater than the width or diameter of the interconnector 142, the interconnector 142 may be stably separated or released from the first clamp P1 and the second clamp P2.

At this time, in the present embodiment, the first contact portion P11 may have a recess R, which is formed so as to be spaced further apart from the second clamp P2 (more accurately, from the second contact portion P12) than a contact C. The recess R serves to reduce the area of the contact C in the first contact portion P11, which actually comes into contact with the interconnector 142. Thereby, the force applied to the interconnector 142 by the first contact portion P11 is concentrated on the contact C, which may increase the pressure (or stress) for clamping the interconnector 142. This is because the pressure may increase when the area is reduced under the application of the same amount of force.

The surface of the recess R, which is close to the second clamp P2 (or the interconnector 142), is spaced further apart from the second clamp P2 than the surface of the contact C, which is close to the second clamp P2, and the shape of the recess R is not limited thereto. Thus, the surface of the recess R that is close to the second clamp P2 may have any of various shapes including a curved surface, or a plurality of flat surfaces or slopes, and may have any of various shapes including semicircular, rectangular, and triangular shapes when viewed in cross section. When the surface (e.g. an inner surface) of the recess R that is close to the first clamp P1 is curved, the recess R has no portion on which the pressure is concentrated, and thus may have a stabilized structure. In one example, when viewed in cross section, the surface of the recess R that is close to the first clamp P1 may have an arc shape.

In addition, the contact C may be configured as a flat surface having a smaller curvature, a smaller bend, or a smaller slope than the recess R. Thereby, the force applied to the interconnector 142 may be sufficiently transferred to the contact C, and for example, damage to or deformation of the interconnector 142 due to the contact C may be prevented.

At this time, the ratio of the area of the contact C relative to the first contact portion P11 may range from 10% to 70%. When the ratio is below 10%, the area of the contact C may be too small to stably clamp the interconnector 142. When the ratio exceeds 70%, the area of the contact C is increased, causing force to be concentrated on the contact C, which may result in an insufficient increase in clamping pressure force.

A plurality of contacts C (e.g. two or more contacts) may be provided in the longitudinal direction of each interconnector 142 so as to come into contact with the interconnector 142, or may be located on opposite sides of at least one recess R interposed therebetween in the longitudinal direction of the interconnector 142. This is because the contact C may have difficulty in stably catching the interconnector 142 when only one contact C is provided or when the contact C is provided on only one side of the recess R. In one example, when three or more contacts C are provided in the longitudinal direction of the interconnector 142 so as to come into contact with the interconnector 142, the interconnector 142 may be more stably fixed. For example, when the contact C is located on either end of the first contact portion P11 and when one or a plurality of contacts C is provided on the center axis of the first contact portion P11, the interconnector 142 may be stably fixed.

Although the maximum number of contacts C that come into contact with the interconnector 142 is not limited, when the number of contacts C is ten or more, the area of one contact C is reduced, and thus the contact C may have difficulty in stably clamping the interconnector 142. In one example, the number of contacts C may range from three to five. However, the present inventive concept is not limited thereto.

In the present embodiment, the recess R is formed in the direction in which the interconnector 142 extends, or in the direction crossing the processing direction. When the recess R is formed in the direction parallel to the direction in which the interconnector 142 extends, the recess R may not transfer force for clamping the interconnector 142, which may prevent the interconnector 142 from being stably clamped. In particular, when the interconnector 142 has a rounded shape or a circular cross section as in the present embodiment, no contact may be located on the portion at which the interconnector 142 is located due to processing error or the like, which may cause the interconnector 142 to be unintentionally easily released. On the other hand, when the recess R is formed in the direction crossing the direction in which the interconnector 142 extends, even if the vertical position (i.e. the position in the z-axis of the drawing) of the interconnector 142 that comes into contact with the contact C slightly varies due to processing error or the like, a portion of the contact C may come into contact with the interconnector 142, and thus the interconnector 142 may be stably clamped. At this time, because the recess R may be elongated perpendicular to the direction in which the interconnector 142 extends, the recess R and the contact C may be stably formed.

As described above, when the recess R is elongated across both ends of the first contact portion P11 in the direction perpendicular to the direction in which the interconnector 142 extends or the processing direction, even if the vertical position of the interconnector 142 varies, the interconnector 142 may be stably clamped. Therefore, the ratio of the area of the contact C may be reduced so that the force applied to the interconnector 142 is concentrated on the contact C, which may ensure effective clamping. Accordingly, in this instance, the area of the contact C may be less than the area of the recess R in the contact portion P11. The ratio of the area of the contact C relative to the first contact portion P11 may range from 10% to 45% (more specifically, from 10% to 30%). When the ratio is 45% or less (more specifically, 30% or less), the force applied to the interconnector 142 may be concentrated on the contact C so that the interconnector 142 may be more effectively clamped.

Various examples of the first contact portion P11 having the recess R will now be described with reference to FIG. 21. FIG. 21 is a side view illustrating the first contact portion P11 and the interconnector 142 in the interconnector attachment apparatus 200 for the solar cell panel 100 according to various alternative embodiments of the present inventive concept. For simplified illustration, in FIG. 21, only the first contact portion P11 and the interconnector 142 are illustrated.

Figure 21:
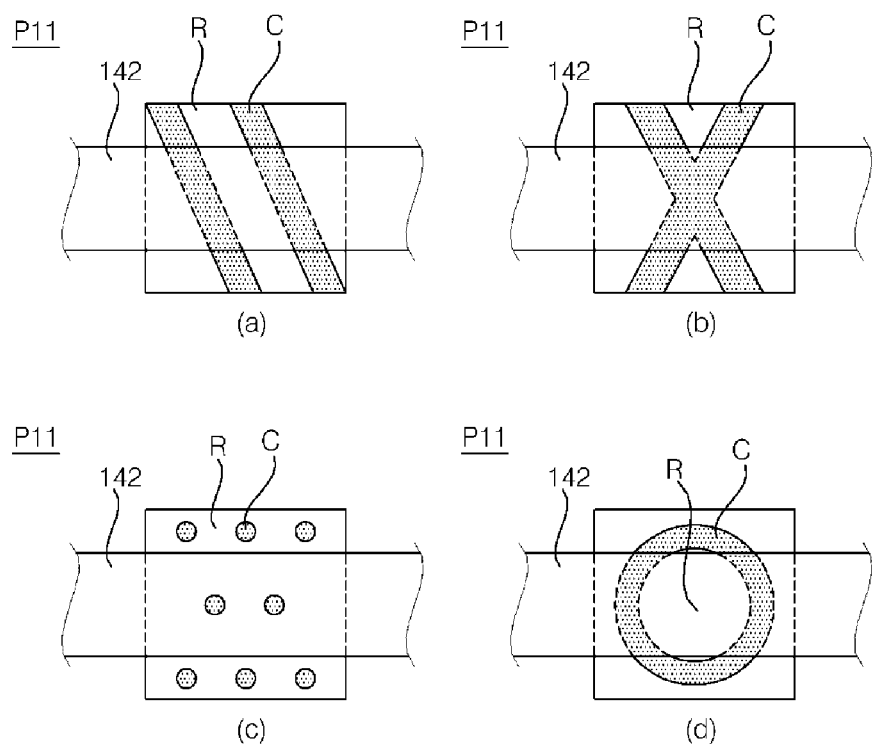
FIG. 21 is a side view illustrating the first contact portion and the interconnector in the interconnector attachment apparatus for the solar cell panel according to various alternative embodiments of the present inventive concept.

As illustrated in (a) of FIG. 21, a plurality of recesses R may be longitudinally arranged parallel to one another in a direction that is inclined relative to the direction in which the interconnector 142 extends or relative to the processing direction.

Alternatively, as illustrated in (b) of FIG. 21, a plurality of recesses R may be inclined at different first and second angles relative to the direction in which the interconnector 142 extends or relative to the processing direction, and may cross each other.

Alternatively, as illustrated in (c) of FIG. 21, a plurality of recesses R may take the form of islands that are spaced apart from one another. Even in this instance, the interconnector 142 comes into contact with contacts C, which are located on opposite sides of the recess R interposed therebetween, in the longitudinal direction of the interconnector 142. Thereby, the contacts C may stably clamp the interconnector 142 even if they are integrally connected to one another in a portion excluding the recesses R.

Alternatively, as illustrated in (d) of FIG. 21, an integrally formed single recess R may be provided. Even in this instance, the interconnector 142 comes into contact with contacts, which are located on opposite sides of the recess R interposed therebetween, in the longitudinal direction of the interconnector 142. Thereby, the interconnector 142 may be stably clamped even if one recess R is provided.

The recess R may have any of various other plan shapes.

Referring again to FIGS. 15, 19 and 20, the second contact portion P21 may be configured as a flat surface having a smaller curvature, a smaller bend, or a smaller slope than the first contact portion P11. Thereby, when the interconnector 142 is clamped by the first contact portion P11 having the recess R and the second contact portion P21, the second contact portion P21 may stably come into contact with one side of the interconnector 142, and in this state, the other side of the interconnector 142 may apply pressure to the interconnector 142 in the state in which force is concentrated on a contact C of the second contact portion P21. That is, when the first contact P11 having the recess R and the second contact portion P21 having only a flat surface are used together, stability may be improved. In addition, damage to or deformation of the interconnector 142 in the second contact portion P21 may be prevented.

The drawing illustrates the clamps P1 and P2 provided on the first fixing part 241 by way of example. The description related to the first part 2411, the second part 2412, and the clamps P1 and P2 of the first fixing part 241 may be directly applied to the first part 2421, the second part 2422, and the clamps of the second fixing part 242, and thus, a detailed description thereof will be omitted.

As illustrated in the enlarged circle of FIG. 16, with the exception that clamps P1 and P2 of the third fixing part 254 protrude upward from the first part 2541 and the second part 2542 of the third fixing part 254, the description related to the first part 2411, the second part 2412, and the clamps P1 and P2 of the first fixing part 241 may be directly applied to the first and second parts 2541 and 2542 and the clamps P1 and P2 of the third fixing part 254. Similarly, the description related to the first part 2411, the second part 2412, and the clamps P1 and P2 of the first fixing part 241 may be directly applied to the first and second parts 2481 and 2482 of the interconnector fixing member 248.

In addition, the above description and the drawings illustrate that the clamps P1 and P2 protrude downward from the first and second fixing parts 241 and 242 and the clamps P1 and P2 protrude upward from the third fixing part 254 and the interconnector fixing member 248. Thereby, in the first, second and third fixing parts 241, 242 and 243 and the interconnector fixing member 248, which constitute the jig 243, the clamps P1 and P2 may be vertically symmetrical to each other. However, the present inventive concept is not limited thereto, and the direction in which the clamps P1 and P2 protrude from the jig 243, the third fixing part 254 and the interconnector fixing member 248 is not limited thereto.

In addition, the drawing illustrates that all of the first, second and third fixing parts 241, 242 and 243 and the interconnector fixing member 248, which constitute the jig 243, include the clamps P1 and P2 having the shape or structure described above. However, the present inventive concept is not limited thereto. Thus, at least one of the first, second and third fixing parts 241, 242 and 243 and the interconnector fixing member 248, which constitute the jig 243, may have the clamps P1 and P2 having the shape or structure described above, and the other clamps may have different shapes.

According to the interconnector attachment apparatus 200 of the present embodiment, the interconnector 142 having a rounded portion may be attached to the solar cell 150 using an automated system. At this time, the first contact portion P11 of the clamps P1 and P2 of the fixing parts 241, 242 and 254 or the interconnector fixing member 248 for fixing the interconnector 142 may have the recess R therein in order to maximize the amount of pressure that is applied to the interconnector 142, thereby stably clamping the interconnector 142. Thereby, the productivity of the interconnector attachment apparatus 200 may be improved by preventing, for example, defects and processing delay, which may occur when the interconnector 142 is unintentionally released at the time of attachment of the interconnector 142.

The above described features, configurations, effects, and the like are included in at least one of the embodiments of the present inventive concept, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the inventive concept as disclosed in the accompanying claims.

What is claimed is:

1. A solar cell connecting method for manufacturing a solar cell string, the solar cell connecting method comprising:
   cutting a plurality of first interconnectors fixed to a first fixing member;
   placing the plurality of first interconnectors on a working table by the first fixing member fixing both sides of the plurality of first interconnectors in a longitudinal direction and transporting the plurality of first interconnectors in a state that the plurality of first interconnectors are spaced apart from each other at intervals;
   placing a first solar cell on the plurality of first interconnectors, fixing the first solar cell and the plurality of first interconnectors by an exhaust adsorption, and releasing the first fixing member from the plurality of first interconnectors;
   placing a plurality of second interconnectors on the first solar cell and the working table by the first fixing member fixing both sides of the plurality of second interconnectors in a longitudinal direction and transporting the plurality of second interconnectors in a state that the plurality of second interconnectors are spaced apart from each other at intervals,
   wherein a first region of the plurality of second interconnectors is positioned on the first solar cell, and a second region of the plurality of second interconnectors is positioned on the working table;
   placing a second solar cell on the second region of the plurality of second interconnectors, fixing the second solar cell and the plurality of second interconnectors by the exhaust adsorption, and releasing the first fixing member from the plurality of second interconnectors; and
   heat-treating the first and second solar cells and the plurality of first and second interconnectors, so as to attach the plurality of first interconnectors and a back electrode of the first solar cell, attach the plurality of second interconnectors and a front electrode of the first solar cell, and attach the plurality of second interconnectors and a back electrode of the second solar cell.

2. The solar cell connecting method according to claim 1, wherein the exhaust adsorption is performed by an exhaust adsorption device.

3. The solar cell connecting method according to claim 1, wherein the working table includes a conveyor belt having an exhaust hole, and
   wherein the exhaust adsorption is performed through the exhausting hole by an exhaust device.

4. The solar cell connecting method according to claim 1, wherein the first fixing member includes a first fixing part and a second fixing part for fixing the both sides of the plurality of first interconnectors or the plurality of second interconnectors in the longitudinal direction.

5. The solar cell connecting method according to claim 4, wherein, in the placing of the plurality of first interconnectors or the plurality of second interconnectors,
   one sides of the plurality of first interconnectors or the plurality of second interconnectors are fixed by a second fixing member, and
   the first fixing part of the first fixing member for fixing the one sides of the plurality of first interconnectors or the plurality of second interconnectors is released from the plurality of first interconnectors or the plurality of second interconnectors.

6. The solar cell connecting method according to claim 4, wherein the first fixing part and the second fixing part of the first fixing member are released from the plurality of first interconnectors or the plurality of second interconnectors, after placing of the first solar cell on the plurality of first interconnectors or placing the second solar cell on the plurality of second interconnectors.

7. The solar cell connecting method according to claim 1, wherein a first fixing part is provided on one side of the plurality of first interconnectors or the plurality of second interconnectors so as to extend in a direction crossing a direction in which the plurality of first interconnectors or the plurality of second interconnectors extend, and
   wherein a second fixing part is provided on an opposite side of the plurality of first interconnectors or the plurality of second interconnectors so as to extend in a direction crossing a direction in which the plurality of first interconnectors or the plurality of second interconnectors extend.

8. The solar cell connecting method according to claim 1, further comprising
   placing an upper fixing member on the plurality of second interconnectors on the first solar cell.

9. The solar cell connecting method according to claim 8, wherein the upper fixing member includes a plurality of fixing pieces configured as elastic members to apply pressure to the plurality of second interconnectors so as to fix the plurality of second interconnectors.

* * * * *